United States Patent
Mazumder

(10) Patent No.: US 10,153,014 B1
(45) Date of Patent: Dec. 11, 2018

(54) DQS-OFFSET AND READ-RTT-DISABLE EDGE CONTROL

(71) Applicant: MICRON TECHNOLOGY, INC., Boise, ID (US)

(72) Inventor: Kallol Mazumder, Plano, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/680,006

(22) Filed: Aug. 17, 2017

(51) Int. Cl.
| | |
|---|---|
| *G11C 7/00* | (2006.01) |
| *G11C 7/10* | (2006.01) |
| *G11C 11/4063* | (2006.01) |
| *H03K 19/003* | (2006.01) |
| *H03K 19/0175* | (2006.01) |
| *G11C 7/22* | (2006.01) |
| *G11C 29/02* | (2006.01) |

(52) U.S. Cl.
CPC .......... *G11C 7/1057* (2013.01); *G11C 7/1084* (2013.01); *G11C 7/22* (2013.01); *G11C 11/4063* (2013.01); *G11C 29/022* (2013.01); *H03K 19/003* (2013.01); *H03K 19/017509* (2013.01)

(58) Field of Classification Search
CPC ....... H01L 2924/00; H01L 2224/48091; H01L 2924/00014; H01L 2924/1305; H01L 2924/13091; H01L 2224/16225; H01L 2924/1306; H01L 2924/14; H01L 2924/15311; H01L 2224/16145; H01L 2224/4824
USPC ......... 365/222, 194, 233.1, 189.05, 193, 63, 365/191, 233.11, 233.12, 233.13, 51, 158, 365/189.011, 189.04, 189.06, 189.14, 365/189.16

See application file for complete search history.

(56) References Cited

U.S. PATENT DOCUMENTS

| | | | |
|---|---|---|---|
| 6,924,686 | B2 | 8/2005 | Kirsch |
| 9,373,376 | B2 | 6/2016 | Jung et al. |
| 9,601,170 | B1 | 3/2017 | Mazumder |
| 2012/0254873 | A1 | 10/2012 | Bringivijayaraghavan |
| 2013/0318285 | A1* | 11/2013 | Pignatelli ............ G06F 12/0246 711/103 |
| 2014/0198591 | A1 | 7/2014 | Morgan et al. |

OTHER PUBLICATIONS

PCT International Search Report & Written Opinion for PCT Application No. PCT/US2018/028894 dated Aug. 9, 2018; 11 Pages.

* cited by examiner

*Primary Examiner* — Thong Q Le
(74) *Attorney, Agent, or Firm* — Fletcher Yoder, P.C.

(57) ABSTRACT

Devices, systems, and methods include controls for on-die termination (ODT) and data strobe signals. For example, a command to de-assert ODT for a data pin (DQ) during the read operation. An input, such as a mode register, receives an indication of a shift mode register value that corresponds to a number of shifts of a rising edge of the command in a backward or a falling edge in a forward direction. A delay chain delays the appropriate edge of received command the number of shifts in the corresponding direction to generate a shifted edge command signal. Combination circuitry then combines a falling edge command signal with a shifted rising edge command signal to form a transformed command.

20 Claims, 15 Drawing Sheets

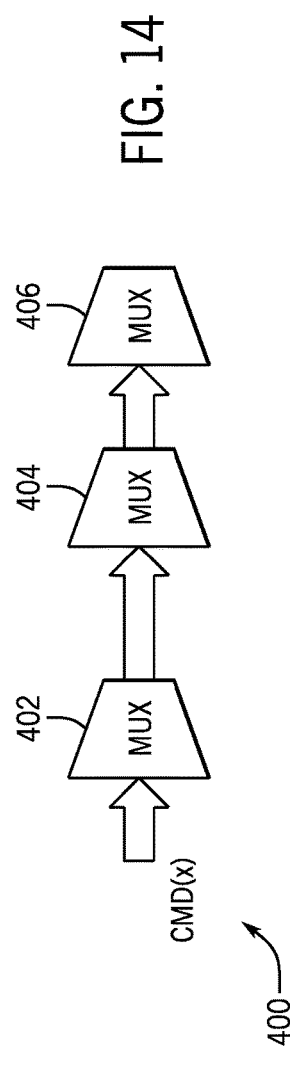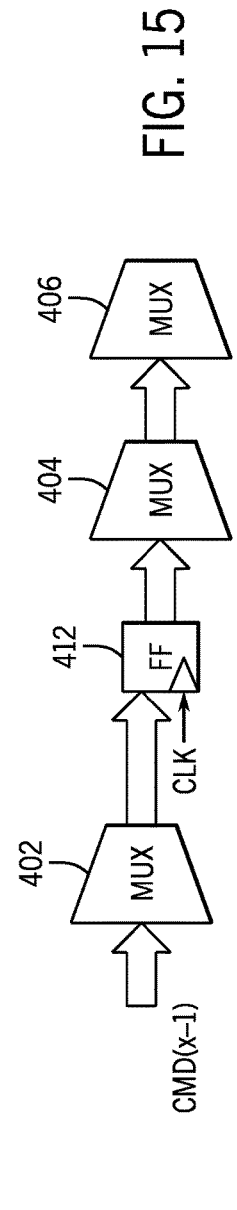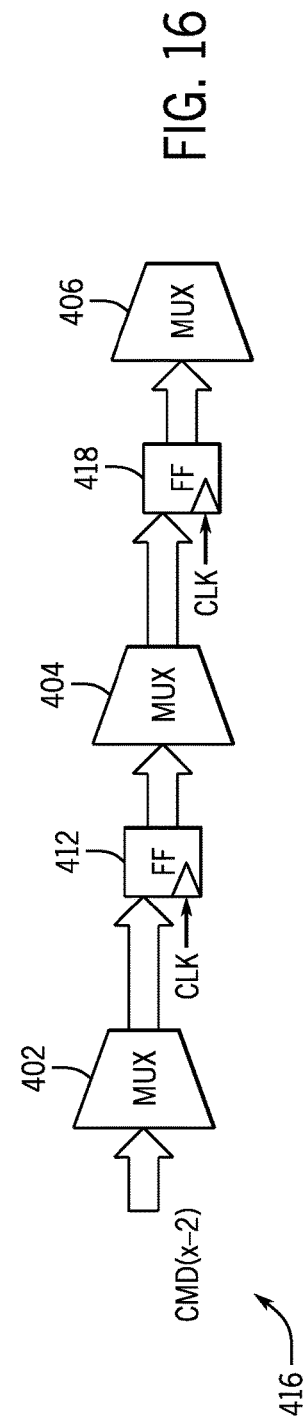

US 10,153,014 B1

DQS-OFFSET AND READ-RTT-DISABLE EDGE CONTROL

BACKGROUND

Field of the Present Disclosure

Embodiments of the present disclosure relate generally to the field of semiconductor devices. More specifically, embodiments of the present disclosure relate to dynamic on-die terminations (ODT).

Description of Related Art

A semiconductor device, such as a microcomputer, memory, gate array, among others, may employ on-die termination (ODT). Activation of the ODT may interfere with some operations (e.g., a memory read) but may enhance other operations (e.g., a memory write). Thus, the ODT may be dynamically de-activated/activated using a signal, RTT (e.g., RTT WR), that is asserted/de-asserted based on various factors. For example, RTT may include one of four types: 1) RTT-PARK a non-command-based that at any time enabled in a mode-register, 2) Dynamic RTT that happens with a WRITE command, 3) WR-Nominal-RTT happens with a non-target WRITE command, and 4) RD-Nominal-RTT happens with a non-target READ command. All of these modes can produce ODT at a data pin (DQ). For a READ operation, all of these types of RTT may be disabled during the read-burst to prevent causing a conflict at the DQ. In some embodiments, there may be a priority list than determines which type of RTT has precedence overall and/or in certain conditions. For example, in some embodiments, RTT-PARK may have a lowest priority while an RTT-OFF (ODT disable) during a READ has the highest priority.

In some embodiments of a memory device, the RTT signal may be de-asserted to create a dynamic non-ODT window based on a cas-write-latency (CWL), a cas latency (CL), a burst-length of data, a write preamble, and/or latency-independent. CL is the column access strobe latency that is the delay time between when a memory controller tells the memory module to access a particular memory column and when the data in given array location is available. Moreover, the CL is a period of time from when a read command is asserted to the reading of the first data in a number of clock cycles. However, this timing may be very rigid to prevent the dynamic RTT window from being active during other operations (e.g., READ operation) that may be negatively effected by RTT being active.

Embodiments of the present disclosure may be directed to one or more of the problems set forth above.

BRIEF DESCRIPTION OF DRAWINGS

FIG. 14 illustrates a block diagram of a multiplexer chain that includes three multiplexer delays in a single clock cycle, according to an embodiment;

FIG. 15 illustrates a block diagram of a multiplexer chain that distributes three multiplexer delays across two clock cycles, according to an embodiment;

FIG. 16 illustrates a block diagram of a multiplexer chain that distributes three multiplexer delays across three clock cycles, according to an embodiment.

DETAILED DESCRIPTION

Figure 1:
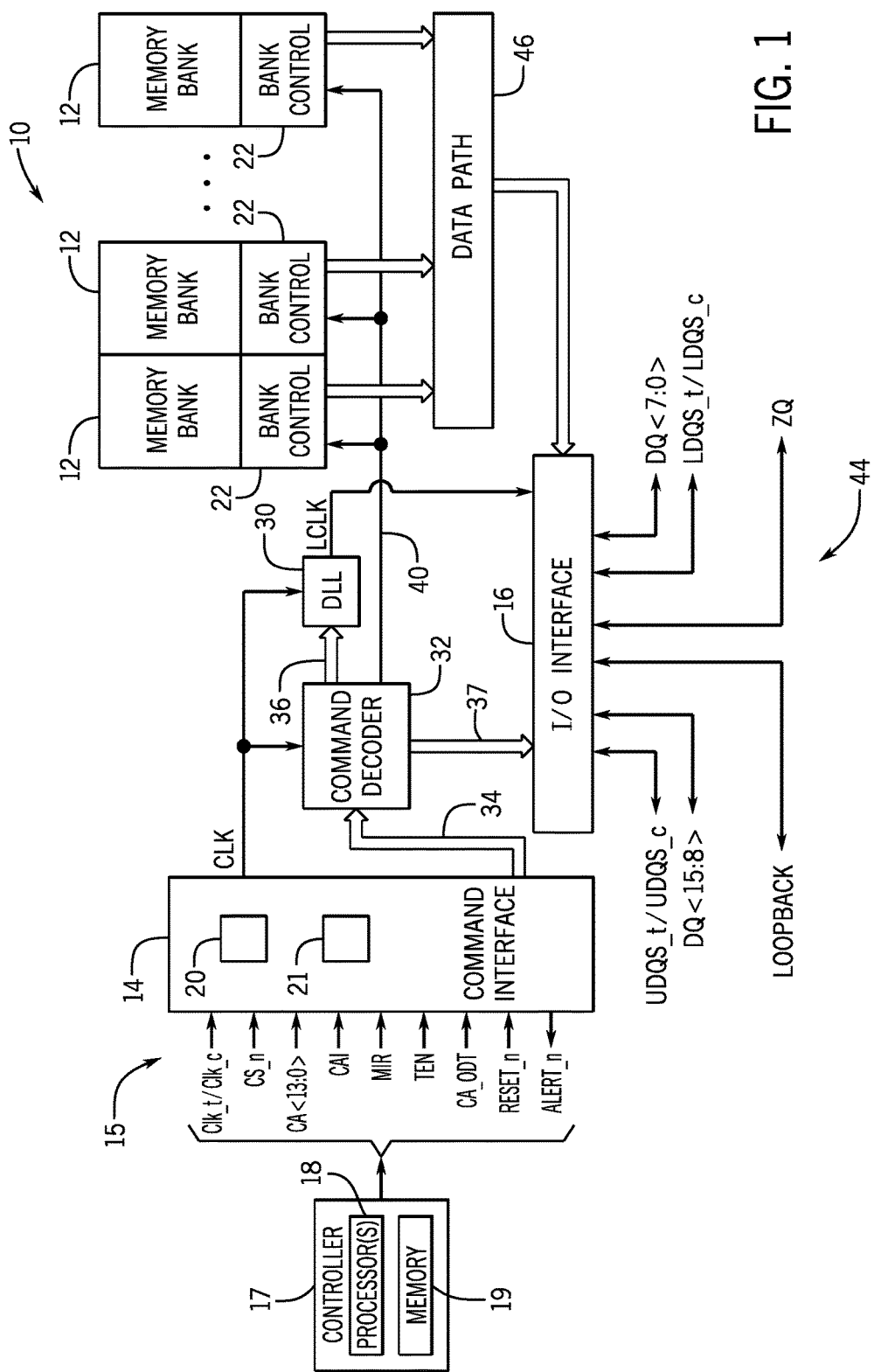
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, an on-die termination (ODT) may be dynamically asserted during a first operation (e.g., write operation) and/or deasserted during a second operation (e.g., read operation). However, this ODT termination may be shifted relative to the first operation and a default ODT assertion command (e.g., RTT) to provide timing flexibility or enhance certain implementation aspects.

To enable shifts in both forward and backward directions, a delay chain may delay a total number of shifts in both directions with a default "unshifted" command being delayed by a maximum number of shifts in the "backward direction." In other words, by delaying the default command, earlier commands are "shifted backwards" relative to the default command. The shifted commands may be used for their rising or falling edges. Two shifted commands may then be combined to utilize independent rising and falling edges to enable shifting of edges of the ODT de-assertion command independently. As long as the two shifted commands overlap, a simple OR gate may be used to generate a stretched and shifted de-assertion command.

The shifted commands may include non-ODT pulses used to de-assert ODT during the read operation. A first pulse may be used to disable data pin (DQ) ODT, and a second pulse may be used to disable data strobe pin (DQS) ODT. The data pin is used to transfer data, and the data strobe pin helps ensure that the data on the data pin is captured properly. Since the signals at these pins may be used separately, each has its own non-ODT pulse that may be shifted and/or stretched using mode registers. However, in some embodiments, the non-ODT DQS pulse should occur anytime that non-ODT DQ pulse is asserted. To ensure this, a DQS offset may be used to offset the non-ODT DQS pulse relative to the non-ODT DQ pulse. Thus, any shifts on the non-ODT DQS pulse may also include DQS offset compensation. Furthermore, since the non-ODT DQ pulse is asserted during a data read and data is read after a read preamble, a non-default length of the read preamble may change causing a shift on the non-ODT DQS. In other words, if the read preamble has a length (e.g., 2) that is longer than a default length (e.g., 1), the overall read operation may take additional clock cycles by shifting the data reading a number of clock cycles equal to the difference between the length and the default length. Moreover, the non-ODT DQS pulse may be asserted during before/during the read preamble. Accordingly, a rising edge of the non-ODT DQS pulse may not be changed by the read preamble length, but if a non-default read preamble is used, an overall length of the read operation is stretched. Accordingly, in such cases, a falling edge of the non-ODT DQS pulse may be shifted to ensure that the non-ODT DQS pulse is asserted during the whole read operation.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to receive and provide a number of signals (e.g., signals 15) from an external device, such as controller 17 or a processor. The controller 17 may include a memory 18 and a processor 19. The processor or controller may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 20 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 21 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
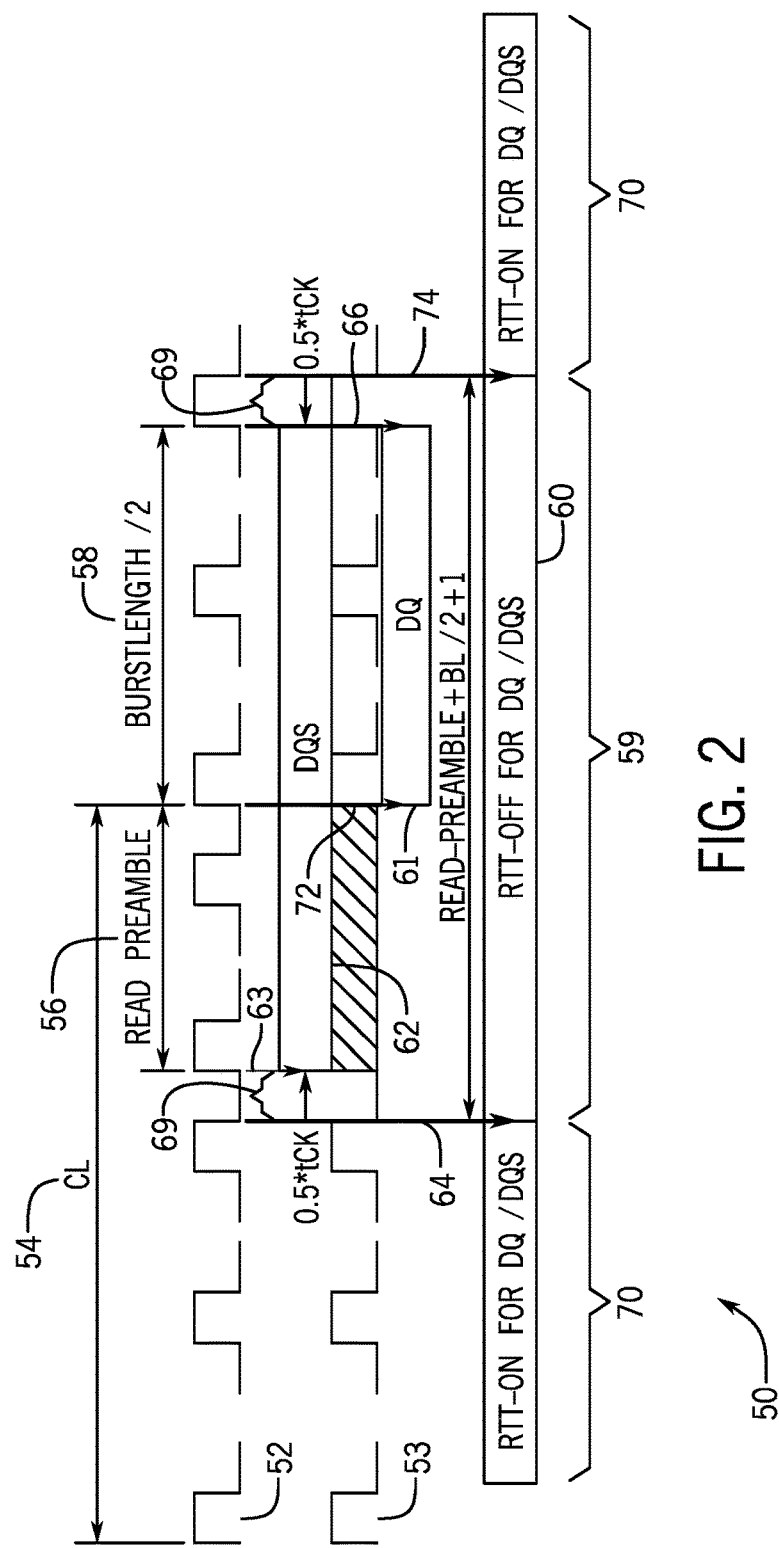
FIG. 2 illustrates a timing diagram indicating a relationship between a non-ODT window and a clock signal, according to an embodiment of the present disclosure.

FIG. 2 illustrates a timing diagram 50 indicating a relationship between a non-ODT window and a clock signal 52 and a data strobe (DQS) signal 53. For a WRITE command, a memory controller 17 drives both DATA (i.e., DQ) as well as the DQS signal 53. The data is "strobed in" to memory device 10. During a READ operation, the memory device 10 drives the DATA on the DQ and toggles the DQS signal 53 as well. The memory device 10 aligns both the DQ as well as the DQS signal 53 to the external CLK using DLL. The DQS toggle for the READ is associated with a read preamble 56 that can have a different shape based on the read preamble cycles setting in the mode-register. During the data-burst (i.e., when DQ starts to drive) the shape of DQS signal 53 looks like a clock. In other words, during the data-burst, the DQS signal 53 has a regular high/low pulse train.

As previously discussed, a delay occurs between a read command and the first reading of the data. This delay is referred to as the CL 54. The CL 54 may be defined in the number of clock cycles of the clock signal 52. The DQS signal 53 is used to "strobe" the data. In some embodiments, prior to data arrival, the DQS signal 53 may behave differently than the clock signal 52. For example, the shape of the DQS signal 53 may appear differently than the pulse train occurring on the clock signal 52. This period may be referred to as a read-preamble that exists on the DQS signal 53. The specific shape may depend on the value on the read preamble cycles (e.g., 1, 2 or 3). The specific shape, along with CL information, aids in identifying an exact time of delivery of the read data.

As part of the CL 54, incoming data to be read as part of the read command may include a read preamble 56. The actual data is read in a read period 58. In the illustrated embodiment, the read period 58 is the burst length divided by two. The read period 58 in this case is the burst length divided by two because the data is being written at a double data rate meaning that the data is read from memory on both falling edges and rising edges of clock signal 52. The burst length is the amount of data that may be read from memory in a single column access (e.g., a length of a prefetch that based on register size and/or number of registers).

As previously discussed, a read operation may be inhibited by ODT during the read operation. Non-ODT periods may be asserted during the read operation using an RTT signal that is de-asserted during the read operation. Specifically, if the mode registers indicate that an appropriate RTT (e.g., RTT-WR) is enabled, dynamic RTT happens with every write command. Similarly, if another RTT mode is set (e.g., RTT-NOM-WR/RTT-NOM-RD), non-target writes and/or reads result in ODT at the DQ. In some embodiments, this assertion of the RTT signal may instead de-assert ODT. A read operation 59 may be defined as a combination of the read preamble 56 and the read period 58. Accordingly, an RTT-OFF signal 60 may occur during the read operation 59 to disable ODT to ensure that the read operation is performed properly. To ensure accuracy of reading during the read operation 59, the RTT-OFF signal 60 (and the read operation 59) may extend at least a portion of a clock period (tCK) before and after actual reading during the operation. The read operation 59 includes a DQ signal 61 and a DQS signal 62. The DQ signal 61 may be actual data being read at a DQ pin of the memory device 10. The DQS signal 62 may be a data strobe that may be provided on a DQS pin of the memory device 10 to be used to ensure that the data on the DQ pin of the memory device 10 is captured properly.

In the illustrated embodiment, a DQS start 63 of a DQS signal 62 occurs half of tCK of the clock signal 52 after a RTT-OFF start 64, and a DQS end 66 occurs half of tCK of the clock signal 52 prior to an RTT-OFF end 68. In other words, the read operation 59 includes buffers 69 that allow parameters to settle between operations. In other embodiments, the difference between the start/end of the DQS signal 62 and the start/end of the RTT-OFF signal 60 may be a whole (or any other portion of a whole) tCK of the clock signal 52. As illustrated, the RTT-OFF signal 60 may have a length that is equal to a sum of the length of the read preamble 56 and the read period 58 and the clock periods between start/end of the write operation and the start/end of the RTT-OFF period 60 (i.e., RTT period 60=preamble+burst length/2+0.5 tCK+0.5 tCK=preamble+burst length/2+1 tCK).

In some embodiments, the read operation 59 may be expanded by shifting the on-edge (RTT-OFF start 64) or the off-edge (RTT-OFF end 68) to the time that is earlier than the read operation 59 or later than the write operation 59, respectively. This flexibility in the timing of ODT, enables a user to more finely tune the timing of the memory device 10 to specific applications. The RTT-OFF start 64 and the RTT-OFF end 68 may be shifted independently. In some embodiments, the direction of shift for each of the edges may be limited to a single direction to ensure that the RTT-OFF signal 60 occurs while the read operation occurs. For example, the RTT-OFF start 64 may only be shifted earlier in time while the RTT-OFF end 68 may only be shifted later in time. In some embodiments, the length of the shift may also be limited to ensure that the RTT-OFF signal 60 does not extend into an adjacent write operation 70 in which ODT may increase accuracy of the write operation. In the following discussion, shifting of the RTT-OFF start 64 and the RTT-OFF end 68 are limited to two clock periods of the clock signal 52. However, in other embodiments, limitations on the shifts may be different based on the edge being shifted and/or may include different shift numbers other than one and two. In some embodiments, the size of the shift may be limited by a maximum number representative mode register to indicate the shift.

As previously noted, the DQ signal 61 may occur during the read operation 59 when target data is being read during the read period 58. The DQ signal 61 includes a DQ start 72 when reading data via the DQ pin begins and a DQ end that corresponds to DQS end 66 when reading data via the DQ pin ends.

Figure 3:
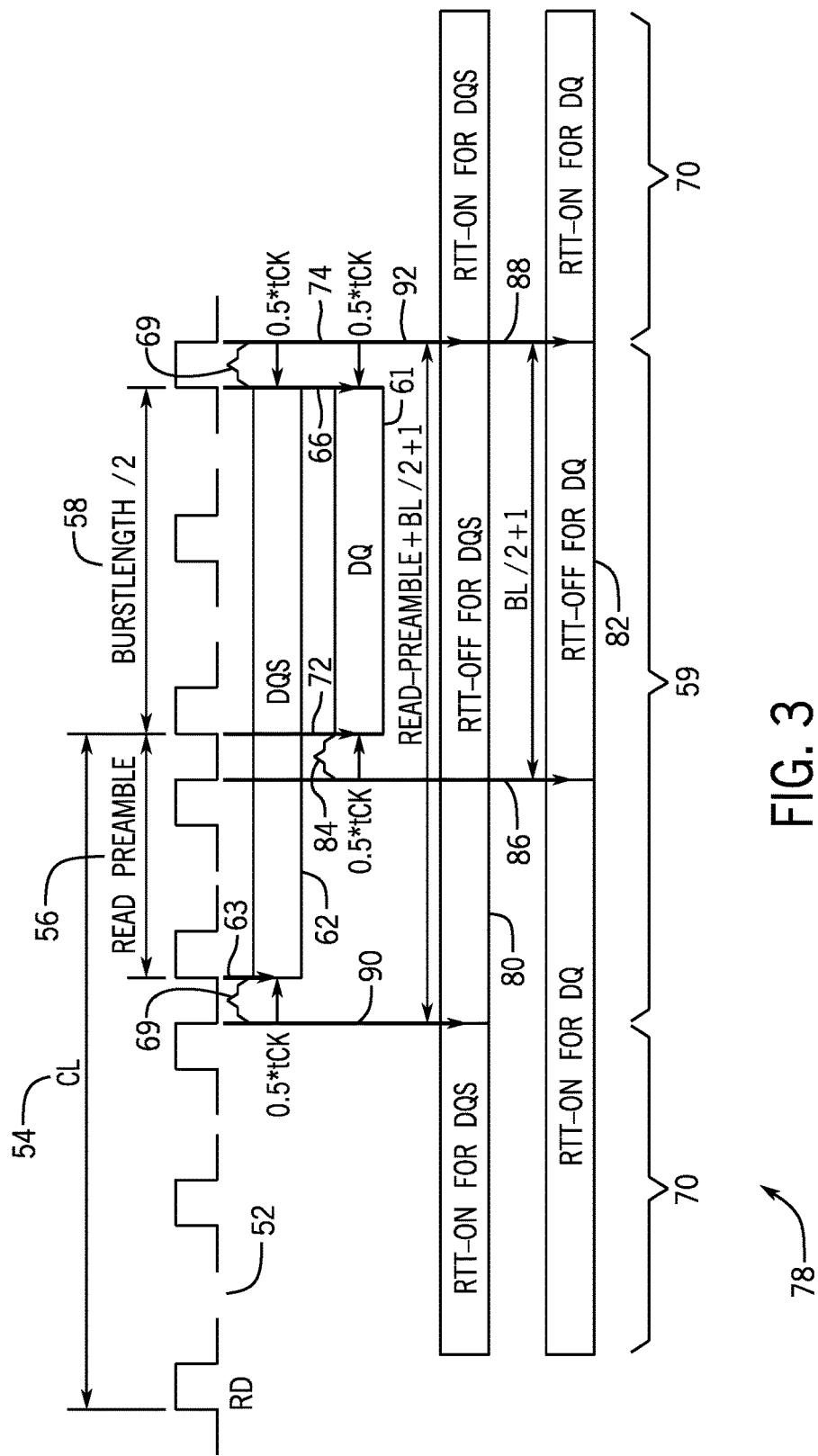
FIG. 3 illustrates a timing diagram that includes separate non-ODT pulses for DQ and DQS to enable the DQ and/or DQS signals to be shifted independently of each other, according to an embodiment of the present disclosure.

FIG. 3 illustrates a timing diagram 78 that includes separate RTT pulses for DQ and DQS to enable the DQ signal 61 and/or DQS signal 63 to be shifted independently of each other. For example, in some embodiments, assertion of the DQS signal 63 may be shifted (e.g., using one or more mode register settings) with respect to the DQ signal 61 but the DQ signal remains fixed based on read latency and burst length. Moreover, ends of the DQS RTT-OFF signal 80 and/or DQ RTT-OFF signal 82 may be independently shifted with respect to the respective DQ signal 61 and the DQS signal 63 using separate mode registers. Since DQS occurs during the entire read operation 59, a DQS RTT-OFF signal 80 may be asserted for DQS only in a way similar to the DQS assertion of the RTT-OFF signal 60 of FIG. 2. When the DQS signal 63 is shifted, the DQS RTT-OFF signal 80 may be shifted and/or stretched accordingly. Since DQ may have ODT asserted/de-asserted separately for ODT assertion for DQS, DQ has a separate DQ RTT-OFF signal 82 that is asserted for some cycle-based delay 84 prior to the read period 58. The cycle-based delay 84 may be the same duration as the buffers 69 or a different duration. The DQ RTT-OFF signal 82 may utilize the same buffer 69 from the DQS end 66 to an end of the read operation 59. The DQ RTT-OFF signal 82 includes a DQ RTT-OFF start 86 and a DQ RTT-OFF end 88. Similarly, the DQS RTT-OFF signal 82 includes a DQS RTT-OFF start 90 and a DQS RTT-OFF end 92. As illustrated, in some embodiments, the DQ RTT-OFF end 88 and the DQS RTT-OFF end 92 may occur at the same time (e.g., an end of the read operation 59).

Figure 4:
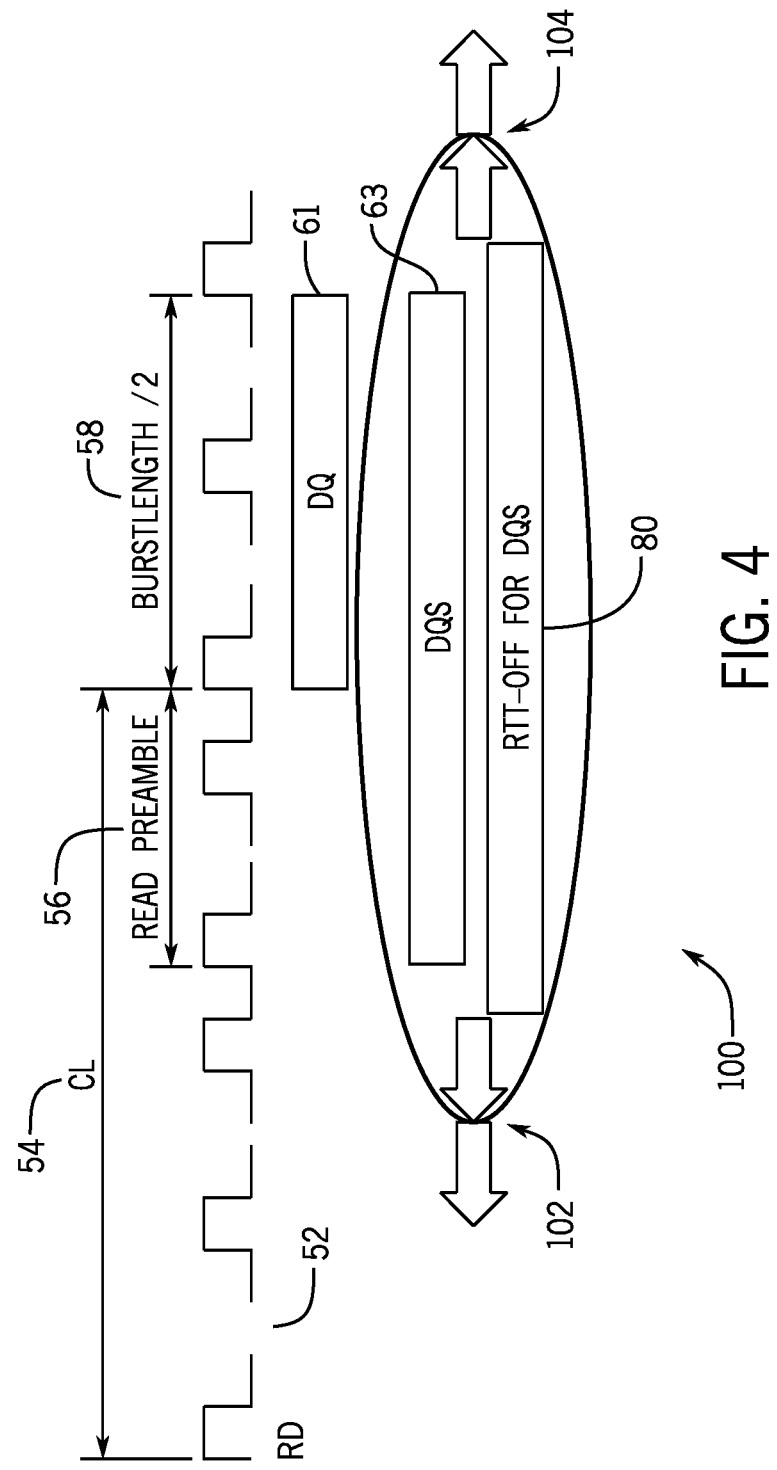
FIG. 4 is a timing diagram illustrating a backward shift of rising edges of the DQS signal and the DQS RTT-OFF signal and a forward shift of falling edges of the DQS signal and the DQS RTT-OFF signal, according to an embodiment of the present disclosure.

FIG. 4 illustrates a timing diagram 100 illustrating a backward shift 102 of rising edges of the DQS signal 63 and the DQS RTT-OFF signal 80 and a forward shift 104 of falling edges of the DQS signal 63 and the DQS RTT-OFF signal 80. For instance, the backward shift 102 of a rising edge or forward shift 104 of a falling of the DQS signal 63 may be indicated in a mode register set by the controller 17. In some embodiments, a first mode register may be dedicated to the rising edge of the DQS signal 63, and a second mode register may be dedicated to the falling edge of the DQS signal 63. Whenever the DQS signal 63 is shifted in either direction, the DQS RTT-OFF signal 80 is shifted as well. Furthermore, the DQS RTT-OFF signal 80 may be shifted independently of the DQS signal 63 by adding additional shifts to the DQS RTT-OFF signal 80 that are not applied to the DQS signal 63. For example, the controller 17 may program a rising edge of the DQS signal 63 to be shifted a number (e.g., DQS Offset of −2) of positions. This shift also causes the corresponding rising edge of the DQS RTT-OFF signal 80 to be shifted the same number of positions (e.g., −2 positions). Moreover, the rising edge of the DQS RTT-OFF signal 80 may also be programmed (e.g., via a mode register) to be shifted by another shift (e.g., −2 more positions) other than the DQS signal 63 shift. This additional shift, along with the DQS offset shift, causes the DQS RTT-OFF signal 80 to experience a total number of shifts (e.g., 4) of the DQS RTT-OFF signal 80 that is greater than a number of shifts (e.g., 2) of the DQS signal 63. In other words, in this case, since these shifts (i.e., DQS offset and RTT independent shifts) occur in the same direction, these shifts are added together for the DQS RTT-OFF signal 80.

Moreover, as previously noted, shifts of the rising edge of the DQS signal 63 may shifted in a forward or a backward direction to ensure that the DQS signal 63 is asserted while the DQ signal 61 is active. Similarly, shifts of the falling edge of the DQS signal 63 may may occur in the forward or backward direction to ensure that the DQS signal 63 is asserted while the DQ signal 61 is active. Furthermore, shifts of the rising edge of the DQS RTT-OFF signal 80 may only occur in the backward direction to ensure that the DQS signal 63 does not occur while ODT is asserted. Similarly, shifts of the falling edge of the DQS RTT-OFF signal 80 may only occur in the forward direction to ensure that the DQS signal 63 does not occur while ODT is asserted.

Figure 5:
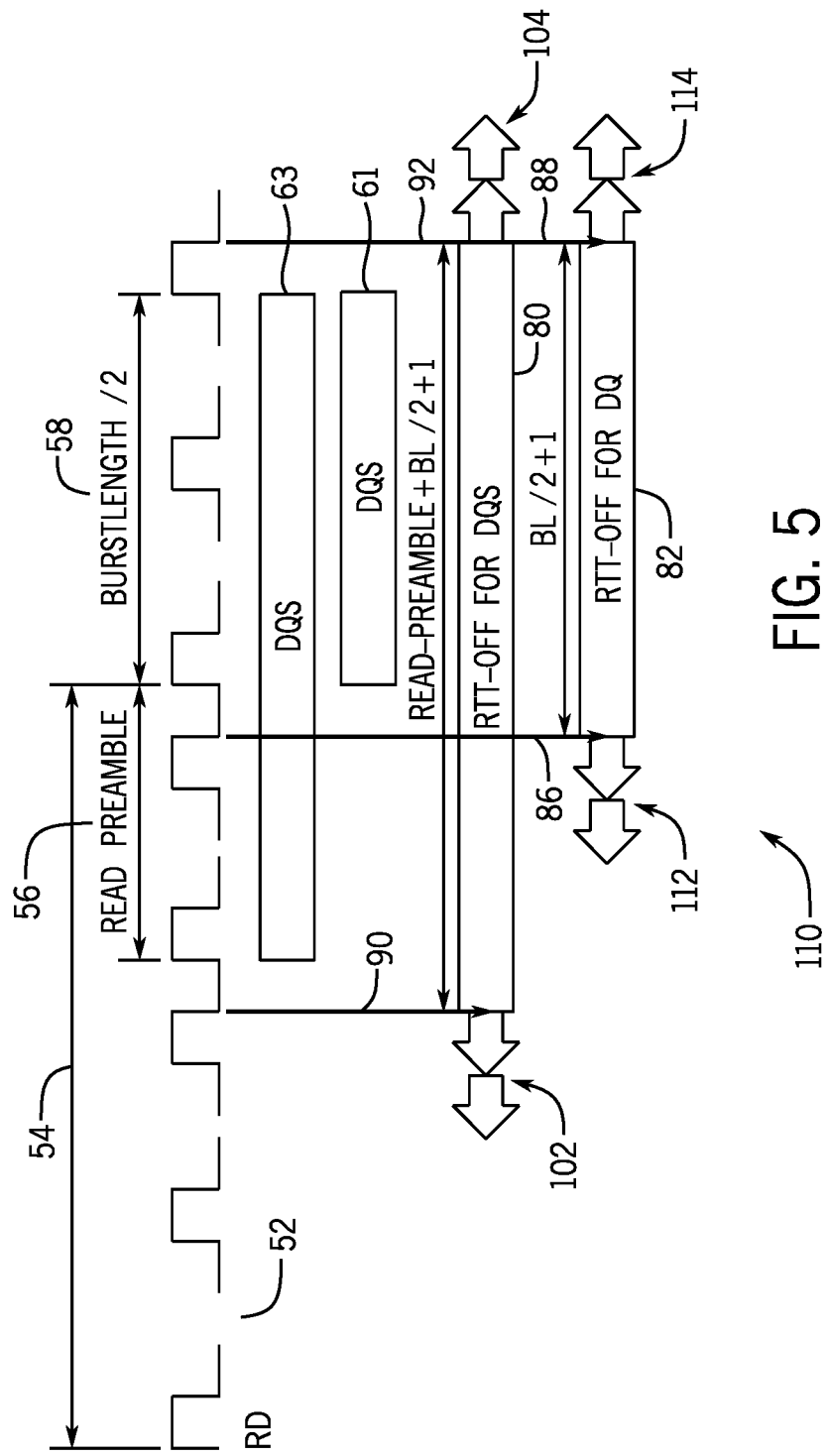
FIG. 5 is a timing diagram illustrating a backward shift of the DQ RTT-OFF signal of FIG. 3, according to an embodiment of the present disclosure.

FIG. 5 illustrates a timing diagram 110 illustrating a backward shift 112 of the rising edge of the DQ RTT-OFF signal 82. The backward shift 112 allows ODT to be asserted or de-asserted for the DQ signal 61 at an earlier time than a default location. In addition to the backward shift 112, a forward shift 114 may be used to shift the falling edge of the DQ RTT-OFF signal 82 in the forward direction to extend the assertion of ODT forward in time. The backward shift 112 and the forward shift 114 may use separate mode registers to enable the rising edge and the falling edge of the DQ RTT-OFF signal 82 to be shifted independently.

Figure 6:
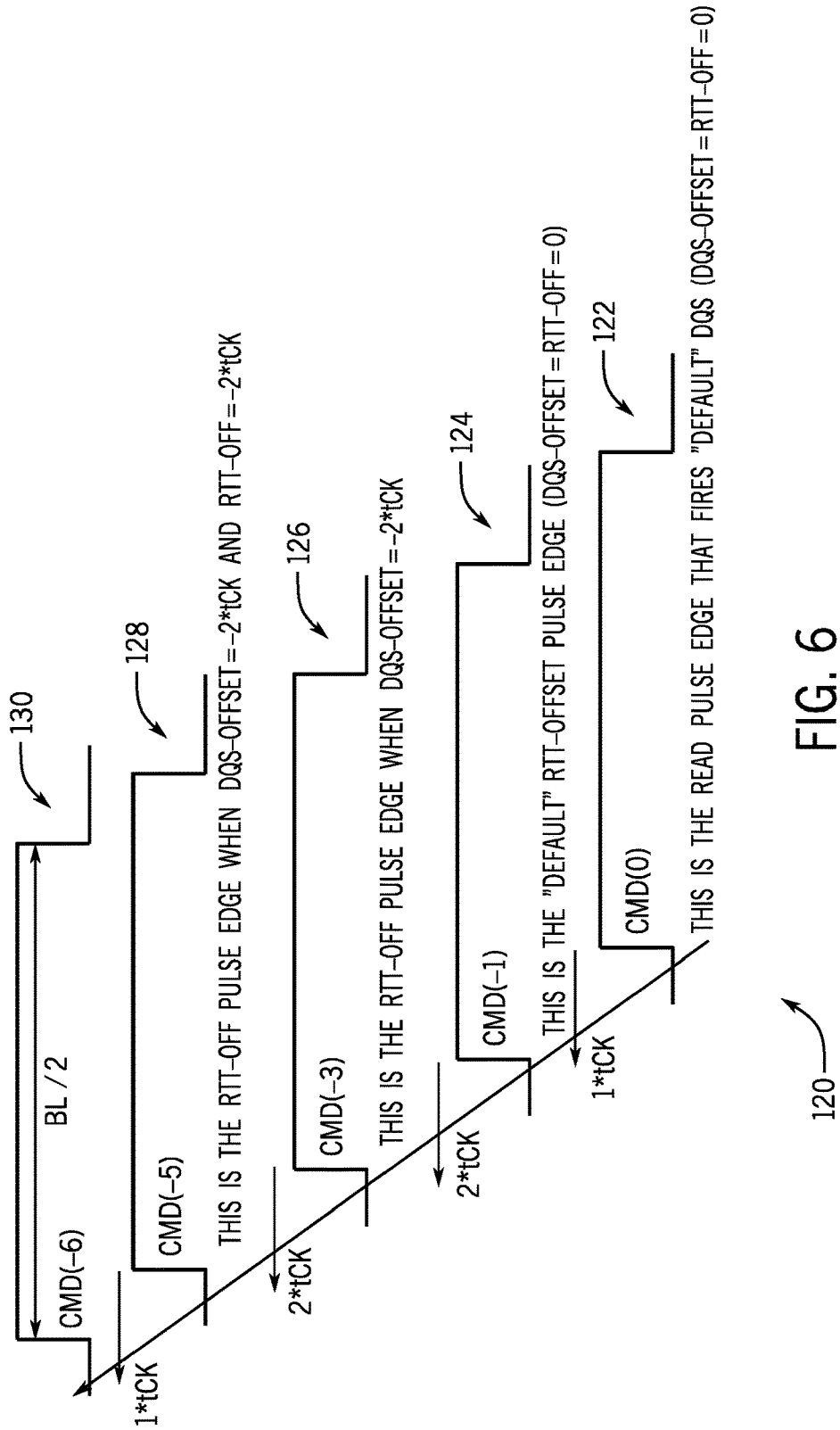
FIG. 6 illustrates a timing diagram that may be used to determine an index value of a command used in tracking shifts of incoming commands, according to an embodiment of the present disclosure.

FIG. 6 illustrates a timing diagram 120 that may be used to determine an index value of a command (e.g., DQS signal 63, DQS RTT-OFF signal 80, DQ RTT-OFF signal 82) that indicates an overall shift for the shifted command. CMD (0) 122 identifies the default location for a rising edge of the DQS command. The rising edge of the DQS RTT-OFF signal 80 occurs some buffering period before the DQS command (e.g., 0.5 tCK or 1 tCK). In the following discussion, a buffering duration is equal to 1 tCK, but other buffering durations may be used in some embodiments. Assuming a buffering duration of 1 tCK, the rising edge of the DQS RTT-OFF signal 80 occurs one clock cycle earlier than CMD (0) 122. Thus, the default location for the rising edge of the DQS RTT-OFF signal 80 is CMD (−1) 124. A backward shift in time is possible by delaying the CMD(0) 122 by some number of delays. For example, the CMD(0) 122 location may be delayed by a number of delays (e.g., flip-flops) that are equal to a maximum number of shifts of the rising edge of the DQS RTT-OFF signal 80, the rising edge of the DQS signal 63 (i.e., DQS Offset), and/or the rising edge of the DQ RTT-OFF signal 82. Since any shifts of the rising edge of the DQS signal 63 and the rising edge of the DQ RTT-OFF signal 82 (if DQ RTT-OFF signal 82 backward shift is longer than the duration of the read preamble 56) also are reflected in shifts of the DQS RTT-OFF signal 80, the maximum number of shifts may be set to only a maximum number of the cumulative backward shifts of the DQS RTT-OFF signal 80. Thus, any command that is shifted in the backward direction would be merely delayed fewer clock cycles. In other words, CMD(0) is a shifted version of an "earlier" signal, how much earlier depends upon the maximum negative DQS-Offset and the maximum negative shift of rising edge of RTT-OFF. Once this earliest possible signal is determined, a correct negative shift may be performed by choosing the correct shifted version from the delay chain, as discussed below.

If the rising edge of the DQS signal 63 is shifted backward by two tCK, the rising edge of the DQS signal 63 is shifted to CMD(−2) (not shown). In the case where the DQS signal 63 is shifted backwards two tCK, the rising edge of DQS RTT-OFF signal 80 is shifted to CMD(−3) 126 to maintain the buffer space. In this case, if a mode register indicates that the rising edge of the DQS RTT-OFF signal 80 is shifted backward 2 tCK relative to the backward shift of the DQS signal 63, the rising edge of the DQS RTT-OFF signal 80 is also shifted backward two more tCK to CMD(−5) 128. In some embodiments where the maximum backward shift of the rising edge of the DQS signal 63 is two and the maximum backward shift of the rising edge of the DQS RTT-OFF signal 80 is two, CMD(−5) 128 is the earliest point used for the commands in the read operation 59. Thus, the CMD(0) 122 may be delayed five times in a delay chain, as discussed below. However, in some embodiments, an additional delay may be generated CMD(−6) 130. The incoming read pulse may be received at CMD(−6) 130. Furthermore, CMD(−6) 130 may be utilized to avoid use of a chain of three multiplexors used in selecting appropriate delayed signals, as will be discussed below.

Figure 7:
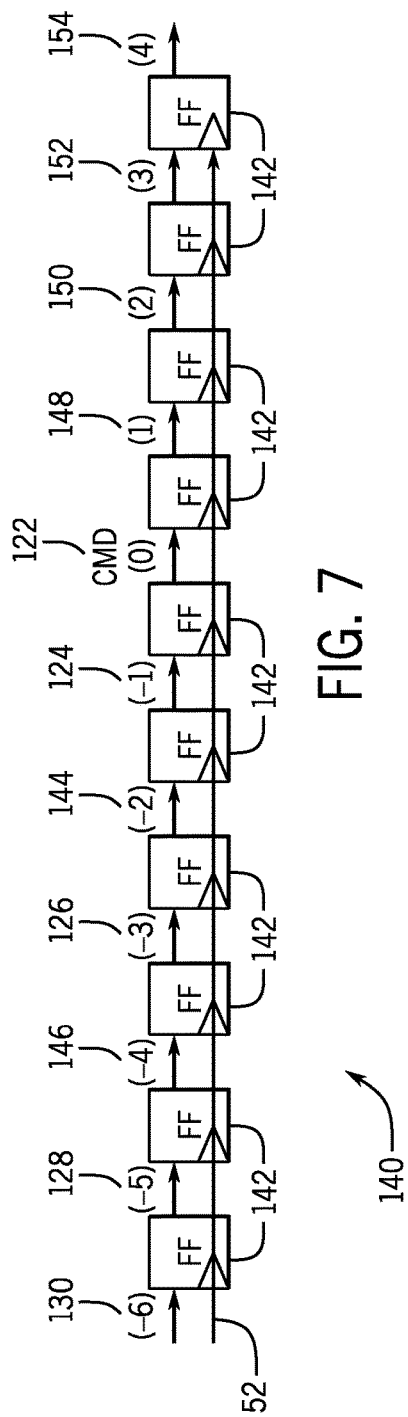
FIG. 7 illustrates a block diagram of a delay chain, according to an embodiment of the present disclosure.

FIG. 7 illustrates a block diagram of a delay chain 140. The delay chain 140 includes 10 flip-flops 142 that are used to delay an incoming command at CMD (−6) 130 by any possible number of shifts of the rising edge or falling edge of the incoming command. As illustrated, the default position for the DQS RTT-OFF signal 80 is CMD (0) 122 that has been delayed six times in the delay chain 140. Similarly, each of the other backwards shifted commands are shifted by a fewer number of delays. For example, a CMD (−2) 144 has been delayed only four times to account for a backward shift of two from the CMD (0) 122. Similarly, CMD (−4) 146 has only been delayed two times through the delay chain 140 generating a backward shift of four from the CMD (0) 122. Forward shifts of the falling edge of the incoming command may also be used as forward shifts similar to the backwards shifts discussed in reference to FIG. 6. To generate such forward shifts, additional flip-flops 142 are used to delay CMD (0) 122 by more delays to create a forward shift. For example, CMD (0) 122 may be delayed one additional time to generate CMD (1) 148 or delayed two additional times to generate CMD (1) 150 or delayed three additional times to generate CMD (3) 152 or delayed four additional times to generate CMD (4) 154.

In some embodiments, incoming read commands have read preamble information encoded. In some embodiments, the read preamble may not be encoded. For example, when present, the read preamble may have a length of one tCK or two tCK. In some embodiments, the read preamble may have other lengths. In the embodiment where the read preamble is limited to a length of one or a length of two, usage of a read preamble having a length of two causes the read command to be shifted earlier by one tCK. The logic may be included in a command generation circuit. Such timing is advantageous in that automatically advances the DQS signal 63 was larger preamble without use of additional processing at the command generation circuit. However, the length of the incoming read pulse does not change in this case. This means that the length of the read preamble is to be taken into account when determining endpoint of the burst. In other words, the duration of the preamble determines how long the DQS signal 63 is fired before the DQ signal 61 and alters both a "latency" and a "burst length" of a final read pulse.

Figure 8:
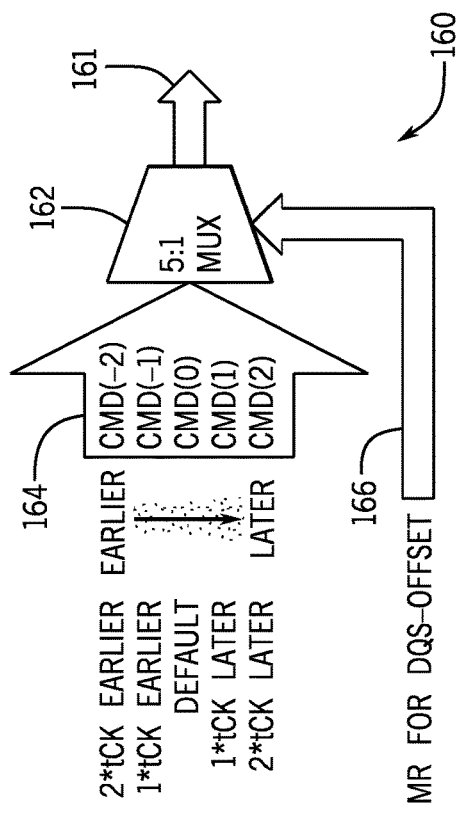
FIG. 8 illustrates a block diagram of selection circuitry that is used to select a shift command using a multiplexer that selects one of multiple commands that are generated in the delay chain of FIG. 7, according to an embodiment.

FIG. 8 illustrates a block diagram of selection circuitry 160 that is used to select a shift command 161 using a multiplexer 162 that selects one of multiple commands 164 that are generated in the delay chain 140. The multiplexer 162 utilizes a mode register 166 (e.g., for the DQS offset) to select an appropriate shifted command 161, in accordance with the previous discussion.

Since a falling edge and a rising edge of the various commands (e.g., the DQS RTT-OFF signal 80) are controlled independently, each of these edges may be generated using separate signals. For example, a first pulse and a second pulse may be used to respectively generate each of the rising and falling edges of the corresponding command. As these two pulses are shifted and then recombined, a new shifted and stretched pulse may be generated. As long as these two pulses overlap, a simple OR gate may be used to recombine these two pulses into the shifted and stretched pulse. Limits on the shifts may be made so that the first and second pulse durations (BL/2) are greater than a period of time from an earliest possible shift to a latest possible shift.

Figure 9:
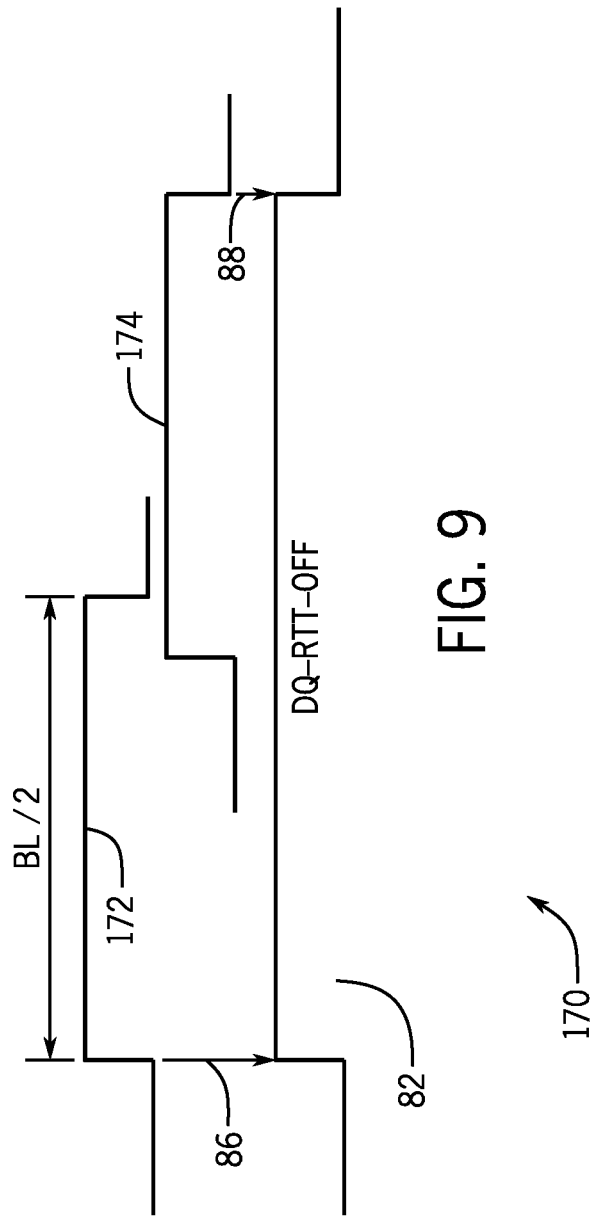
FIG. 9 illustrates a timing diagram of a combination of the DQ RTT-OFF signal of FIG. 5, according to an embodiment.

FIG. 9 illustrates a timing diagram 170 of the combination to form the DQ RTT-OFF signal 82. As previously noted the DQ RTT-OFF signal 82 includes a rising edge occurring at DQ RTT-OFF start 86 and a falling edge occurring at DQ RTT-OFF end 88. As previously discussed, these falling and rising edges may be controlled using separate pulses. In other words, each pulse may have its own edge it controls. A rising edge pulse 172 includes any backwards shifts that are used for the command, and the rising edge pulse 172 sets the DQ RTT-OFF start 86 according. Similarly, a falling edge pulse 174 is the default command shifted by a duration set by a mode register selecting how many forward shifts are used to delay the command from the default location. Such shifts set the DQ RTT-OFF end 88. As long as the shifts in the backward and the forward directions are limited to cause a duration (e.g., BL/2) of the rising edge pulse 172 and the falling edge pulse 174 to overlap, the rising edge pulse 172 and the falling edge pulse 174 may be ORed together to generate the DQ RTT-OFF signal 82 having the rising edge at the DQ RTT-OFF start 86 and a falling edge at the DQ RTT-OFF end 88. For example, if the burst length is 8, limiting shifts to +/−2 ensures that the rising edge pulse 172 and the falling edge pulse 174 will overlap. Note that the read preamble may shift both the rising edge pulse 172 and the falling edge pulse 174 if the read preamble is set to some value other than a default value (e.g., read preamble duration of one).

As previously discussed, the read preamble length shifts DQ RTT-OFF signal 82 as a unit shifting both the rising edge and a falling edge. In other words, the read preamble length determines locations for the rising edge pulse 172 and the falling edge pulse 174. For example, delay selections may be performed differently based on a length of the read preamble. Table 1 illustrates a first set of values for the rising edge and falling edge shifts that may be used when a read preamble length is a single tCK.

TABLE 1

| Shifts in CMD(rising edge shift, falling edge shift) for read preamble = 1 tCK | | | |
|---|---|---|---|
| | Rising edge 2 backward shifts | Rising edge 1 backward shift | Rising edge 0 shifts |
| Falling edge 0 shifts | CMD(−2, 1) | CMD(−1, 1) | CMD(0, 1) |
| Falling edge 1 forward shift | CMD(−2, 2) | CMD(−1, 2) | CMD(0, 2) |
| Falling edge 2 forward shifts | CMD(−2, 3) | CMD(−1, 3) | CMD(0, 3) |

Similar to Table 1, Table 2 may be used for situations where the read preamble is 2 tCKs.

TABLE 2

| Shifts in CMD(rising edge shift, falling edge shift) for read preamble = 2 tCKs | | | |
|---|---|---|---|
| | Rising edge 2 backward shifts | Rising edge 1 backward shift | Rising edge 0 shifts |
| Falling edge 0 shifts | CMD(−1, 2) | CMD(0, 2) | CMD(1, 1) |
| Falling edge 1 forward shift | CMD(−1, 3) | CMD(0, 3) | CMD(1, 3) |
| Falling edge 2 forward shifts | CMD(−1, 4) | CMD(0, 4) | CMD(1, 4) |

As previously discussed, the rising edge and the falling edge pulses may be individually set with the foregoing tables (or similar table values for other read preambles) using separate mode registers.

Figure 10:
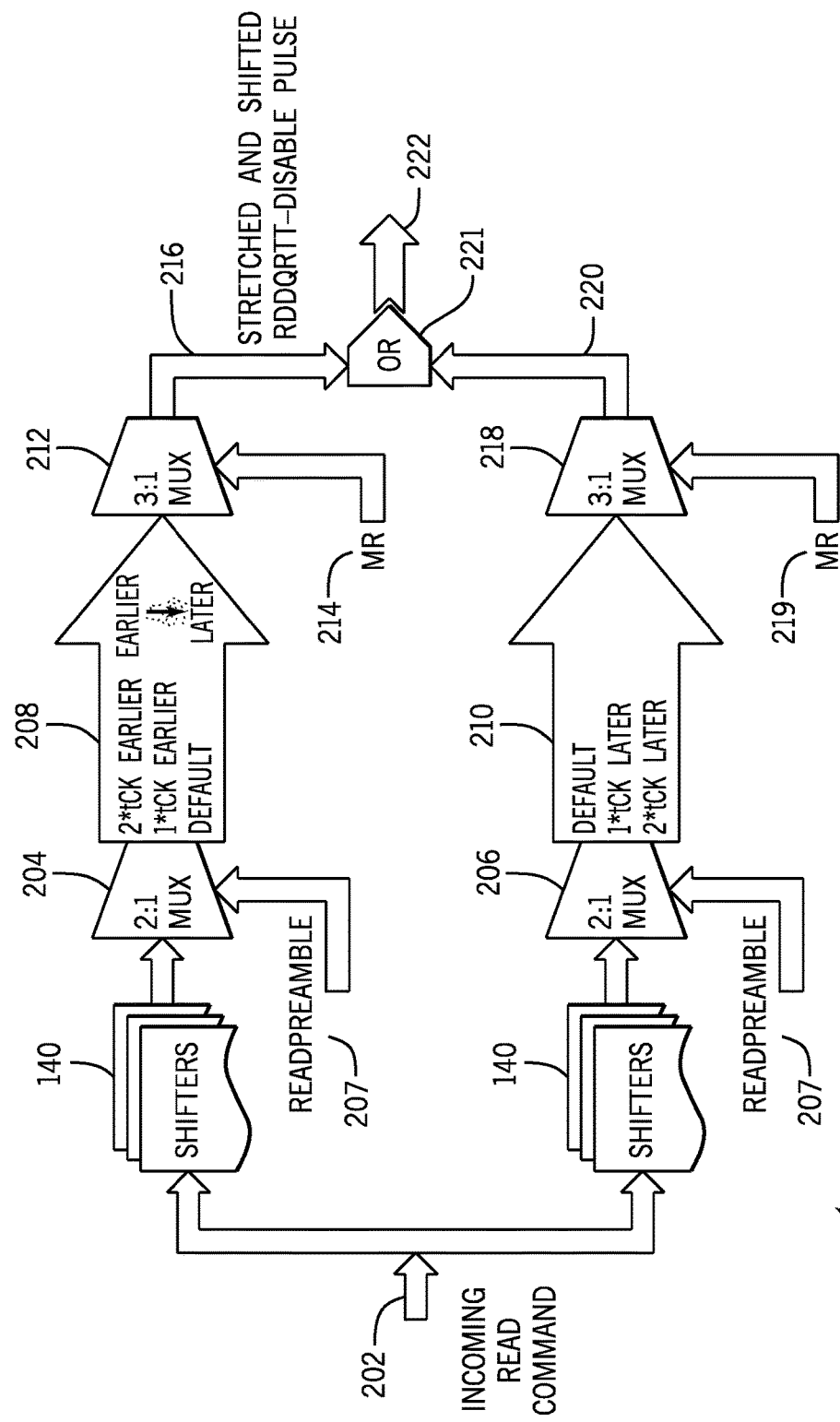
FIG. 10 illustrates a schematic diagram of DQ RTT shifting circuitry that may be used to shift the DQ RTT-OFF signal of FIG. 4, according to an embodiment.

FIG. 10 illustrates a schematic diagram of DQ RTT shifting circuitry 200 that may be used to shift DQ RTT-OFF signal 82 according to the appropriate table above. An incoming read pulse 202 is received into the DQ RTT shifting circuitry 200 indicating that a read is to be performed. The read pulse 202 is then passed into the shifters 140 that create a number of delayed commands equal to a number of possible shifts of the read pulse 202. The shifters 140 may be a single set of shifters in accordance with the shifter 140 of FIG. 7. Alternatively, the shifters 140 may each separately shift the incoming read pulse 202. A set of rising pulse commands are then passed to a rising edge pulse preamble selector 204 and a falling edge pulse selector 206. The rising edge pulse preamble selector 204 selects all possible outputs of the rising edge pulse 192 based on a ReadPreamble value 207 indicating a length of the read preamble and outputs the possible outputs as the shifted rising edges 208. Similarly, the falling edge pulse preamble selector 206 selects all possible outputs of the falling edge pulse 194 based on the ReadPreamble value 207 and outputs the possible outputs as the shifted falling edges 210.

A rising edge pulse selector 212 uses a rising edge mode register 214 to select a backward-shifted rising edge pulse 216 from the shifted rising edges 208. A falling edge pulse selector 218 uses a falling edge mode register 219 to select a forward-shifted falling edge pulse 220 from the shifted falling edges 210. The backward-shifted rising edge pulse 216 and the forward-shifted falling edge pulse 220 are combined using the OR gate 221 to create a stretched and shifted DQ RTT-OFF signal 82.

Figure 11:
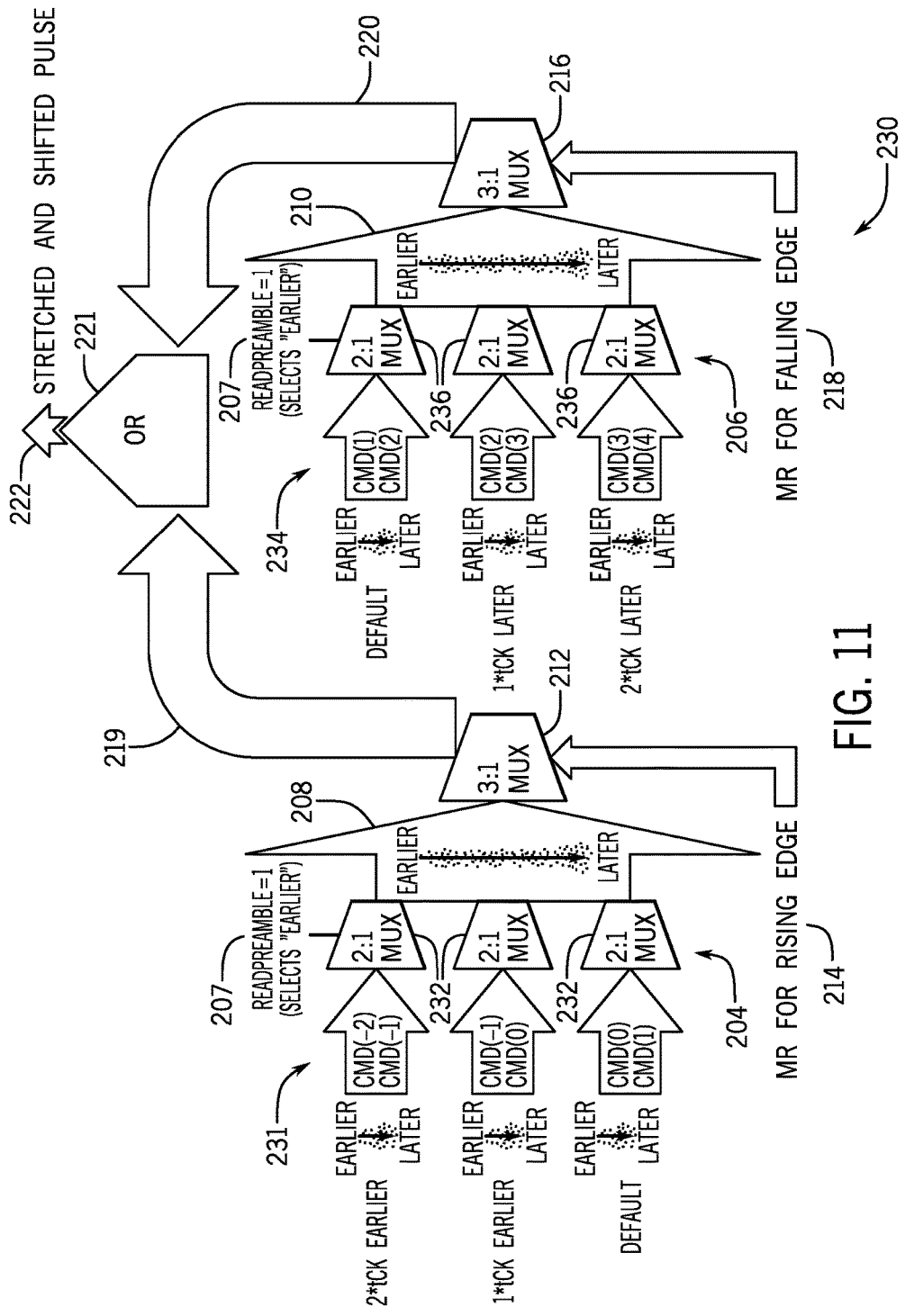
FIG. 11 illustrates a more detailed schematic view of the DQ RTT shifting circuitry of FIG. 10, according to an embodiment.

FIG. 11 illustrates a schematic view of DQ RTT shifting circuitry 230. Possible backward shifted values 231 are passed into the rising edge preamble selector 204. As illustrated, the rising edge preamble selector 204 selects from the possible backward shifted values 231 according to the ReadPreamble 207 here, having a value of 1. The rising edge preamble selector 204 includes three multiplexers 232 that are used to select an earlier value of possible shifts based on the ReadPreamble 207 being the smaller of possible read preamble lengths. In other words, if a larger read preamble (e.g., 2 tCK) is used, a later possible shift may be selected while a smaller read preamble causes selection of an earlier possible shift. In some embodiments, more than two preamble lengths are possible. In such embodiments, each multiplexer 232 may select from more than two possible values where smaller preamble lengths lead to earlier shifted values. The outputs from the multiplexers 232 (e.g., shifted rising edges 208) are then used to generate the stretched and shifted DQ RTT-OFF signal 82, as discussed previously.

Possible forward shifted values 234 are passed into the falling edge preamble selector 206. As illustrated, the falling edge preamble selector 206 selects from the possible forward shifted values 234 according to the ReadPreamble 207 having any suitable number. Here, the illustrated ReadPreamble 207 has a value of 1 for the shifts being made in the DQ RTT shifting circuitry 200. The falling edge preamble selector 206 includes three multiplexers 236 that are used to select an earlier value of possible shifts based on the ReadPreamble 207 being the smaller of possible read preamble lengths. In the multiplexers 236 similar to the multiplexers 232, if a larger read preamble (e.g., 2 tCK) is used, a later possible shift may be selected while a smaller read preamble causes selection of an earlier possible shift. In some embodiments, more than two preamble lengths are possible. In such embodiments, each multiplexer 232 may select from more than two possible values where smaller preamble lengths lead to earlier shifted values. The outputs from the multiplexers 236 (e.g., shifted falling edges 210) are then used to generate the stretched and shifted DQ RTT-OFF signal 82, as discussed previously.

Shifting DQS RTT-OFF signal 80 includes additional issues. Specifically, two different mode registers effect DQS RTT-OFF signal 80. A direct shift of the DQS RTT-OFF signal 80 is possible via a first mode register and indirect shifts are possible via shifts (e.g., DQS offset) to the DQS signal 63 via its own mode register due to the DQS RTT-OFF signal 80 is moved in lockstep with the DQS signal 63. Table 3 illustrates a first set of values for the rising edge and falling edge shifts that may be used for a DQS RTT-OFF signal 80 when a read preamble length is a single tCK.

TABLE 3

Shifts in CMD(rising edge shift, falling edge shift) for read preamble = 1 tCK

| Read Preamble = 1 | Rising edge backward shift 2 | Rising edge backward shift 1 | No rising edge shift | DQS Offset |
|---|---|---|---|---|
| Falling edge no shift | CMD(-5, -1) | CMD(-4, -1) | CMD(-3, -1) | DQS backward shift of 2 |
| Falling edge with 1 forward shift | CMD(-5, 0) | CMD(-4, 0) | CMD(-3, 0) | |

TABLE 3-continued

Shifts in CMD(rising edge shift, falling edge shift) for read preamble = 1 tCK

| Read Preamble = 1 | Rising edge backward shift 2 | Rising edge backward shift 1 | No rising edge shift | DQS Offset |
|---|---|---|---|---|
| Falling edge with 2 forward shifts | CMD(-5, 1) | CMD(-4, 1) | CMD(-3, 1) | |
| Falling edge no shift | CMD(-4, 0) | CMD(-3, 0) | CMD(-2, 0) | DQS backward shift of 1 |
| Falling edge with 1 forward shift | CMD(-4, 1) | CMD(-3, 1) | CMD(-2, 1) | |
| Falling edge with 2 forward shifts | CMD(-4, 2) | CMD(-3, 2) | CMD(-2, 2) | |
| Falling edge no shift | CMD(-3, 1) | CMD(-2, 1) | CMD(-1, 1) | No DQS shift |
| Falling edge with 1 forward shift | CMD(-3, 2) | CMD(-2, 2) | CMD(-1, 2) | |
| Falling edge with 2 forward shifts | CMD(-3, 3) | CMD(-2, 3) | CMD(-1, 3) | |
| Falling edge no shift | CMD(-2, 2) | CMD(-1, 2) | CMD(0, 2) | DQS forward shift of 1 |
| Falling edge with 1 forward shift | CMD(-2, 3) | CMD(-1, 3) | CMD(0, 3) | |
| Falling edge with 2 forward shifts | CMD(-2, 4) | CMD(-1, 4) | CMD(0, 4) | |
| Falling edge no shift | CMD(-1, 3) | CMD(0, 3) | CMD(1, 3) | DQS forward shift of 2 |
| Falling edge with 1 forward shift | CMD(-1, 4) | CMD(0, 4) | CMD(1, 4) | |
| Falling edge with 2 forward shifts | CMD(-1, 5) | CMD(0, 5) | CMD(1, 5) | |

Table 4 illustrates a second set of values for the rising edge and falling edge shifts that may be used for a DQS RTT-OFF signal 80 when a read preamble length is two tCKs.

TABLE 4

Shifts in CMD(rising edge shift, falling edge shift) for read preamble = 1 tCK

| Read Preamble = 1 | Rising edge backward shift 2 | Rising edge backward shift 1 | No rising edge shift | DQS Offset |
|---|---|---|---|---|
| Falling edge no shift | CMD(-5, 0) | CMD(-4, 0) | CMD(-3, 0) | DQS backward shift of 2 |
| Falling edge with 1 forward shift | CMD(-5, 1) | CMD(-4, 1) | CMD(-3, 1) | |
| Falling edge with 2 forward shifts | CMD(-5, 2) | CMD(-4, 2) | CMD(-3, 2) | |
| Falling edge no shift | CMD(-4, 1) | CMD(-3, 1) | CMD(-2, 1) | DQS backward shift of 1 |
| Falling edge with 1 forward shift | CMD(-4, 2) | CMD(-3, 2) | CMD(-2, 2) | |
| Falling edge with 2 forward shifts | CMD(-4, 3) | CMD(-3, 3) | CMD(-2, 3) | |
| Falling edge no shift | CMD(-3, 2) | CMD(-2, 2) | CMD(-1, 2) | No DQS shift |
| Falling edge with 1 forward shift | CMD(-3, 3) | CMD(-2, 3) | CMD(-1, 3) | |
| Falling edge with 2 forward shifts | CMD(-3, 4) | CMD(-2, 4) | CMD(-1, 4) | |
| Falling edge no shift | CMD(-2, 3) | CMD(-1, 3) | CMD(0, 3) | DQS forward shift of 1 |
| Falling edge with 1 forward shift | CMD(-2, 4) | CMD(-1, 4) | CMD(0, 4) | |
| Falling edge with 2 forward shifts | CMD(-2, 5) | CMD(-1, 5) | CMD(0, 5) | |
| Falling edge no shift | CMD(-1, 4) | CMD(0, 4) | CMD(1, 4) | DQS forward shift of 2 |
| Falling edge with 1 forward shift | CMD(-1, 5) | CMD(0, 5) | CMD(1, 5) | |
| Falling edge with 2 forward shifts | CMD(-1, 6) | CMD(0, 6) | CMD(1, 6) | |

As shown above, the read preamble length does not change the rising edge of the DQS RTT-OFF signal 80. However, a falling edge is changed by the read preamble length since a longer preamble stretches the read operation 59.

Figure 12:
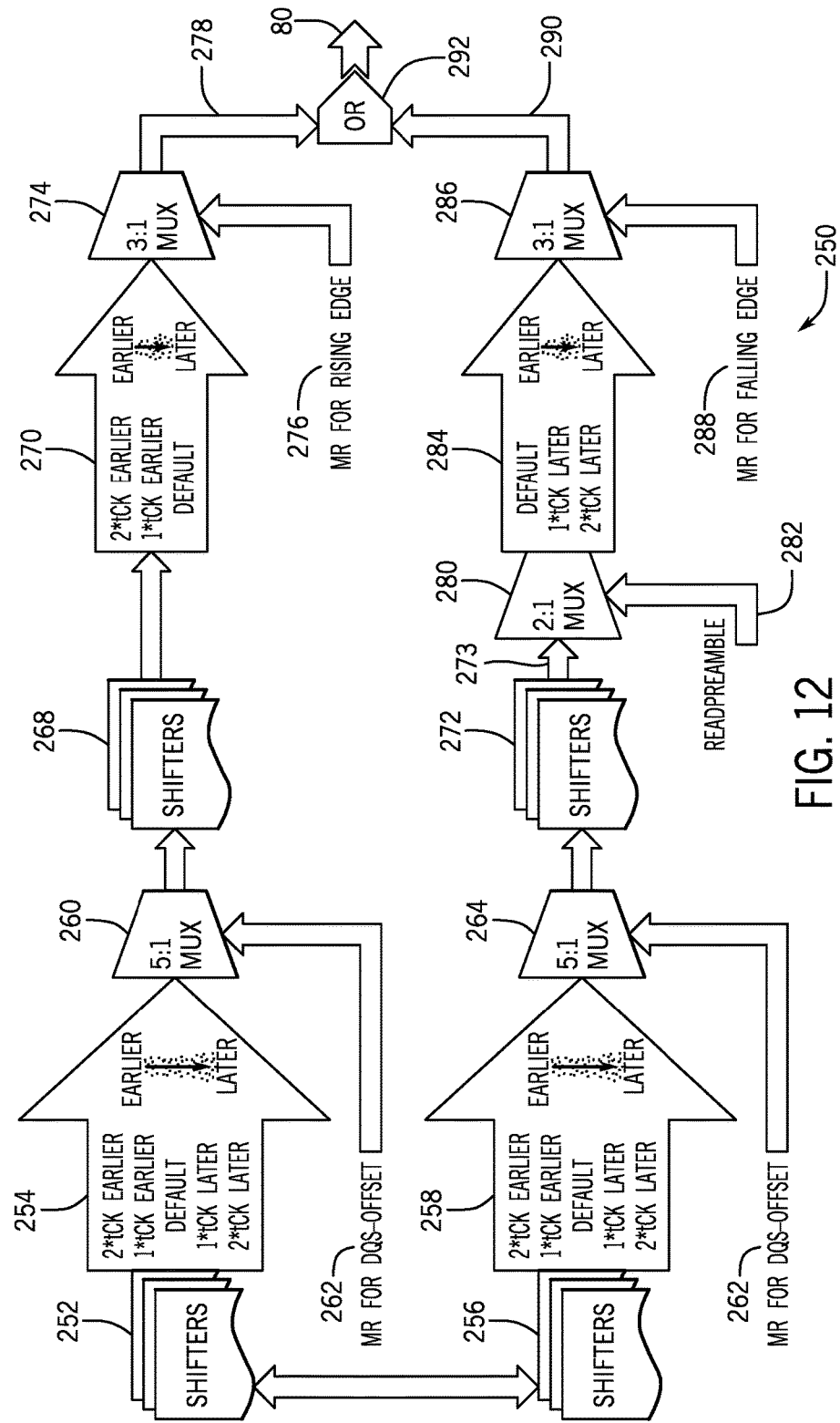
FIG. 12 illustrates a schematic diagram of DQS RTT-OFF shifting circuitry with DQS offset compensation, according to an embodiment.

FIG. 12 illustrates a schematic diagram of DQS RTT-OFF shifting circuitry 250 with DQS offset compensation. The DQS RTT-OFF shifting circuitry 250 includes shifters 252 that produce possible DQS offset shifted commands 254 for the rising edge of an input command received at the shifters 252 (e.g., DQS RTT-OFF signal 80). Similarly, shifters 256 produce possible DQS offset shifted commands 258 for the falling edge of the input command. The shifters 252 and 256 may shift an incoming input command similar to the delay chain 140 of FIG. 7. The DQS offset shifted commands 254 are passed to a rising edge DQS offset selector 260 that uses a mode register 262 to select a DQS offset for a rising edge pulse. Similarly, the DQS offset shifted commands 258 are passed to a falling edge DQS offset selector 264 that uses the mode register 262 to select the same DQS offset for the falling edge pulse. In other words, when the selectors 260 and 264 use the same inputs and mode register 262, the DQS offset shifts the rising edge and falling edge pulses in a same direction and a same number of shifts. However, since such occurrences occur when a default pulse width is used, in some embodiments, the DQS offset may change a rising edge and falling edge differently when a read preamble has a length (e.g., 2 tCK) that is different than the default read preamble (e.g., 1 tCK).

In some embodiments, at least some of the components of the DQS RTT-OFF shifting circuitry 250 may be omitted and/or used for dual purposes. For example, in some embodiments, the shifters 252 and the 256 may include a single set of shifters that provide a single set of DQS offset shifted commands to a common selector or to rising edge DQS offset selector 260 and falling edge DQS offset selector 264 separately. In embodiments wherein a common selector is used, the output of the common DQS selector may be used to generate a rising edge pulse and a falling edge pulse. For example, these embodiments may be used when a read preamble length is consistent.

The DQS offset pulse for the rising edge of DQS RTT-OFF signal 80 is sent to shifters 268 used to generate possible rising edge shifted commands 270 (e.g., backward shifts) of the DQS RTT-OFF signal 80. Similarly, the DQS offset pulse for the falling edge of DQS RTT-OFF signal 80 is sent to shifters 272 that generate possible falling edge shifted commands 273 (e.g., forward shifts) of the DQS RTT-OFF signal 80. The shifters 268 and the shifters 272 may include multiple delaying units (e.g., flip flops 142) that generate the possible shifts of respective edges of the DQS RTT-OFF signal 80. In some embodiments, the shifters 268 and shifters 272 may include a single set of shifters that are used have various taps that are used to generate possible shifts of DQS RTT-OFF signal 80. For example, if a common DQS selector is used to generate the DQS offset shifted command, this DQS offset shifted command may be delayed in the common shifter (e.g., delay chain) with corresponding delay points being tapped for use in generating corresponding rising and falling edges of the DQS RTT-OFF signal 80.

A rising edge selector 274 uses a mode register 276 to select a selected rising edge pulse 278 from the possible rising edge shifted commands 270. Since the falling edge of the DQS RTT-OFF signal 80 varies with read preamble length, a preamble-based falling edge selector 280 uses a read preamble 282 to select possible preamble-based falling edge shifted commands 284 similar to the discussion related to preamble-based shifting in FIG. 10. The rising edge of the DQS RTT-OFF signal 80 does not change based on a length of the preamble. A falling edge selector 286 uses a mode register 288 to select a falling edge pulse 290 from the possible preamble-based falling edge shifted commands 284. The rising edge pulse 278 and the falling edge pulse 290 are then combined using an OR gate 292 to generate the DQS RTT-OFF signal 80.

Figure 13A:
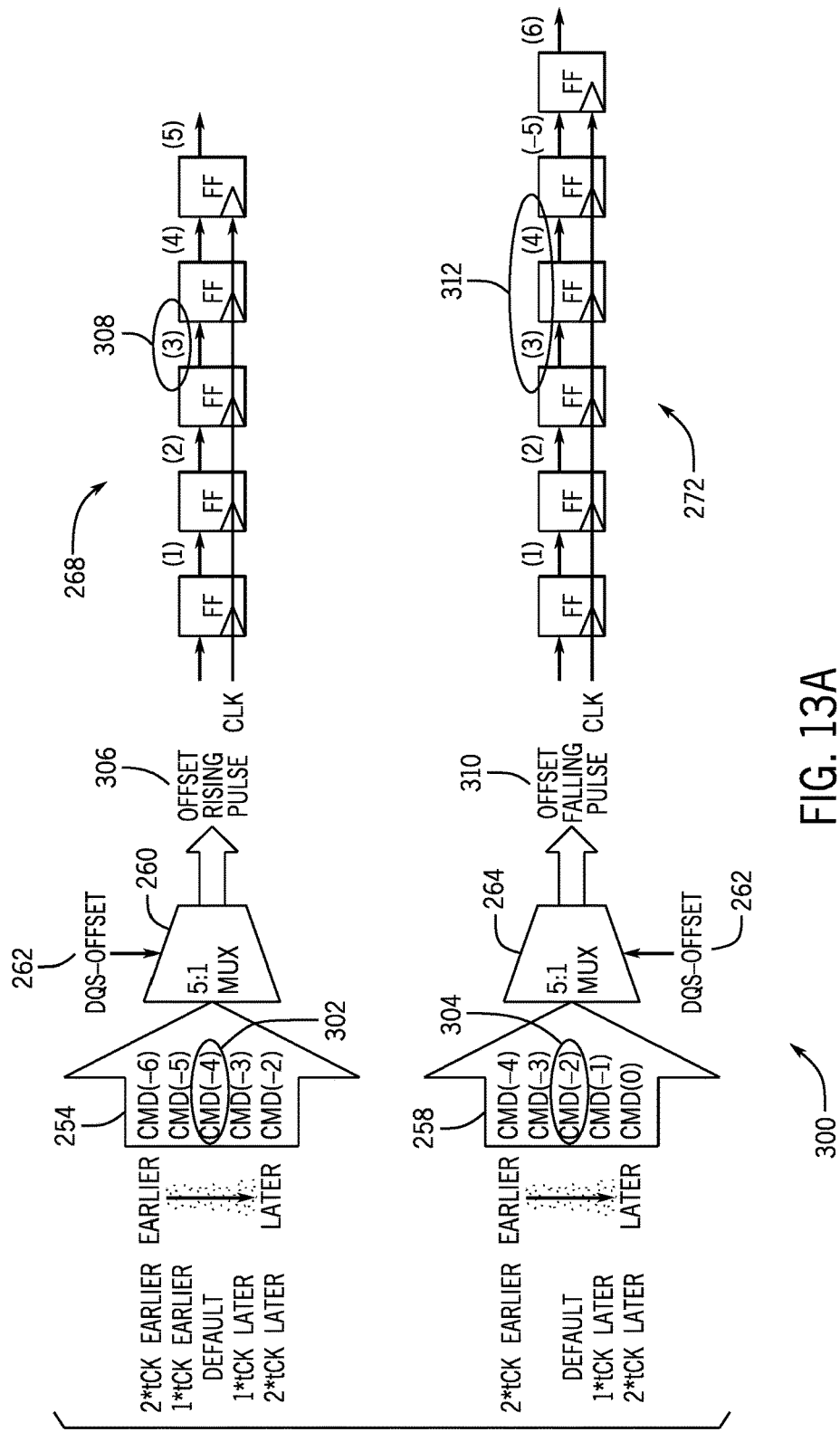
FIGS. 13A & 13B illustrate a more detailed schematic diagram of DQS RTT-OFF shifting circuitry with DQS offset compensation, according to an embodiment.
Figure 13B:
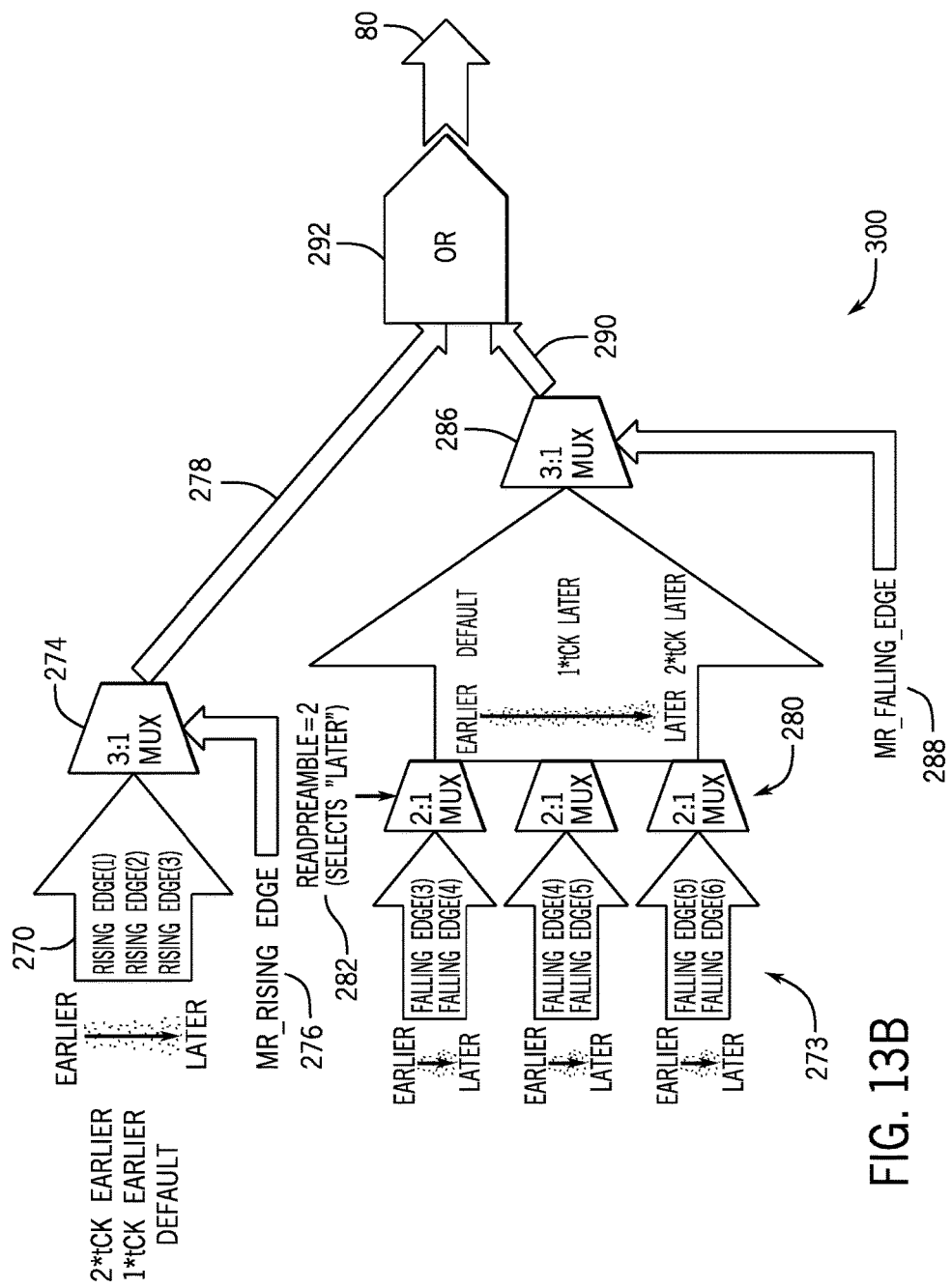

FIGS. 13A & 13B illustrate a schematic diagram of DQS RTT-OFF shifting circuitry 300 with an example application of the DQS RTT-OFF shifting circuitry 300. In some embodiments, the DQS RTT-OFF shifting circuitry 300 may incorporate similar elements to some of those incorporated into DQS RTT-OFF shifting circuitry 250. In the illustrated embodiment of FIG. 13A, the DQS RTT-OFF shifting circuitry 300 utilizes the shifters 252 and 256 to generate possible DQS offset shifted commands 254 and 258. In the illustrated embodiment, the possible DQS offset shifted commands 254 include CMD(−6) to CMD(−2) as possible rising edges due to DQS offset. CMD(−4) 302 is the default location for the rising edge pulse with no offset, but the CMD may be shifted in either direction to offset the DQS at the rising edge. This default position may be determined by a number of shifters (e.g., flip-flops) in the shifting circuitry to achieve the target location as indicated in the appropriate tables previously discussed. The possible DQS offset shifted commands 258 include CMD(−4) to CMD(0) as possible falling edges due to the DQS offset. CMD(−2) 304 is the default location for the falling edge pulse with no offset, but the CMD may be shifted in either direction to offset the DQS at the falling edge.

The selector 260 selects an offset rising edge pulse 306 from the possible DQS offset shifted commands 254 using the DQS offset mode register 262. The offset rising edge pulse 306 is passed into the shifter 268. The shifter 268 provides possible rising edge shifted commands 270 starting at a value set by the DQS offset mode register 262. If the DQS offset mode register 262 sets a shift to three shifts (e.g., default value), the first possible rising edge 308 is the first possible rising edge shifted command 270 (e.g., rising edge (3)=CMD(−1)) passed to the rising edge selector 274 in FIG. 13B. The other possible rising edge shifted commands 270 are backward shifted from the first possible rising edge shifted command 270 (e.g., rising edge (2)=CMD(−2) and rising edge (1)=CMD(−3)).

The selector 264 selects an offset falling edge pulse 310 from the possible DQS offset shifted commands 258 using the DQS offset mode register 262. The offset falling edge pulse 310 is passed into the shifter 272. The shifter 272 provides possible fallings edge shifted commands 273 starting at a value set by the DQS offset mode register 262. If the DQS offset mode register 262 sets a shift to three shifts (e.g., default value), the first possible falling edge 312 is the first possible falling edge shifted command 273 passed to the preamble-based falling edge selector 280 in FIG. 13B. However, the falling edge may change based on a read preamble length. Accordingly, each possible preamble value may be grouped (e.g., paired when there are two possible preamble values) to be passed into the preamble-based falling edge selector 280. As such, in the illustrated embodiment with two possible preamble lengths, the first possible falling edge pair occur at three and four delays. After these delays, the final DQS RTT-OFF signal 80 may be generated in accordance with the foregoing discussion. For example, if the default rising edge location is used (e.g., edge control=0), the CMD(−4) is delayed three times to result in CMD(−1). Similarly, if the default falling edge location is used (e.g., edge control=0), the CMD(−2) is delayed three or four times. Four times is used because a read preamble 282 is 2 rather than the default 1. Accordingly, the DQS shifted falling edge of CMD(−2) is shifted four times to CMD(2). This value corresponds to a DQS RTT-OFF signal 80 location of CMD(−1,2) that is an unshifted falling edge, unshifted rising edge, and DQS offset of zero as indicated in the Table 4, as previously discussed. Furthermore, if the falling edge had been shifted only three times due to a preamble of 1, the DQS RTT-OFF signal 80 location would be CMD(−1, 1), as illustrated in Table 3.

FIG. 14 illustrates a three-MUX chain 400 that includes multiplexers 402, 404, and 406. Since the three-MUX chain 400 includes direct connections between the multiplexers 402, 404, and 406, the delays attributable to each of the multiplexers 402, 404, and 406 all are to occur in a single clock cycle that may not accommodate the delays when the clock has a short period. Instead, the delays may be distributed across two or three clock cycles. FIG. 15 illustrates a three-MUX chain 410 that incorporates a delay 412 to distribute delays attributable to the multiplexers 402, 404, and 406 across two tCKs. FIG. 16 illustrates a three-MUX chain 416 that incorporates the delay 412 and a delay 418 to distribute delays attributable to the multiplexers 402, 404, and 406 across three tCKs.

Figure 17:
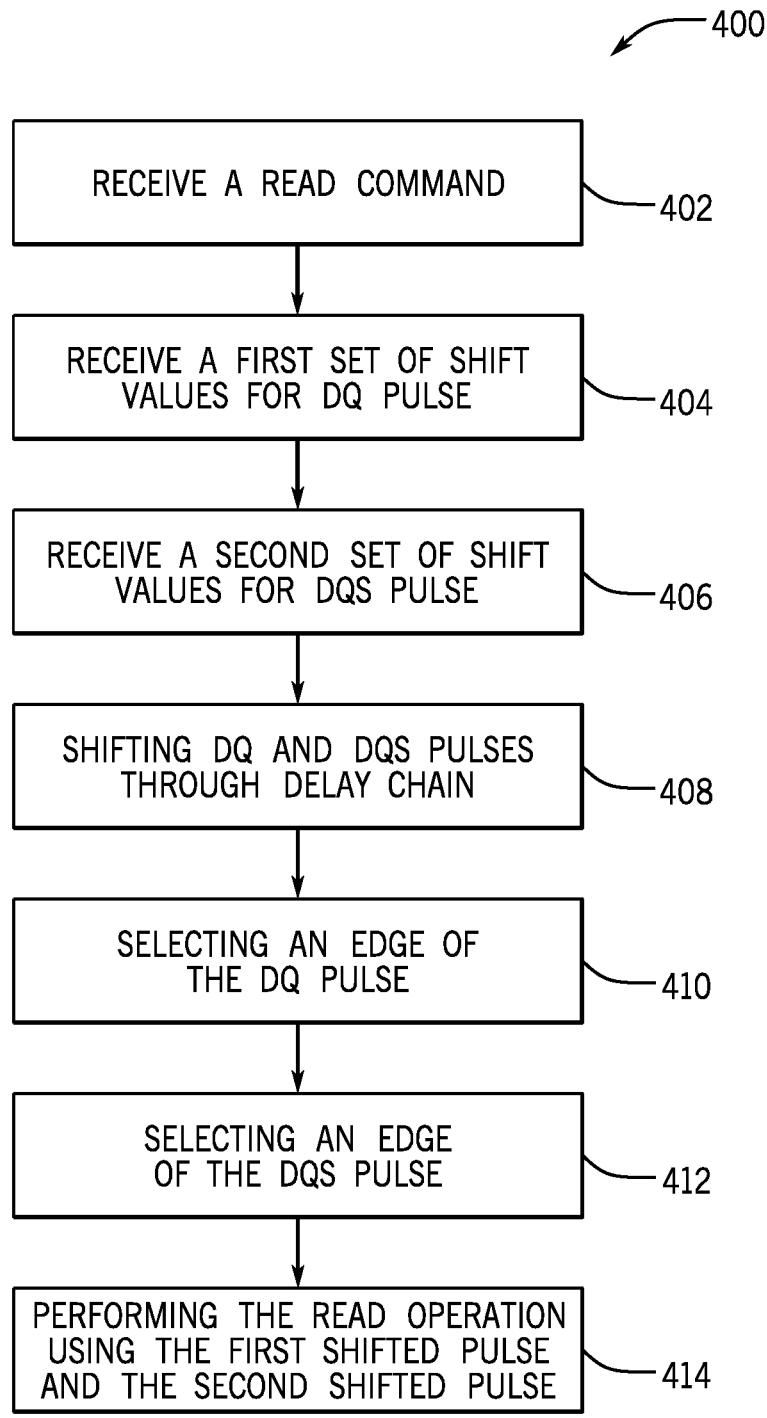
FIG. 17 is a block diagram of a process for shifting and/or stretching ODT pulses for a memory device, according to an embodiment of the present disclosure.

FIG. 17 illustrates a flow diagram of a process 400 for DQS offsetting shifting and/or stretching on-die termination (ODT) pulses for DQ 62 and DQS 61. As previously discussed, DQS offsetting involves shifting the entire DQS 62 with respect to the DQ 61 either earlier or later. Turning off ODT during a READ burst for both DQ 61 as well as DQS 62 may include moving READ-RTT-OFF rising edge earlier as well as the falling edge later. These movements may be performed independently for DQ 61 and DQS 62. In the case where DQS 62 is offset from its default position, the READ-RTT-OFF for DQS 62 automatically moves along with this DQS-Offset movement so as to disable ODT for DQS 62 to avoid conflicts. The READ-RTT-OFF edges may be moved in addition to the DQS-Offset movement.

Additionally, as previously discussed, the Read-RTT-OFF pulses may be used to de-assert ODT during a read operation in a memory device, such as the memory device 10. The process 400 includes receiving a read command from the controller 17 (block 402). In some embodiments, the read command may be received via the command interface 14 or the I/O interface 16 of the memory device 10.

To improve flexibility of operation of the memory device 10, the DQS 62 may be offset and/or RTT OFF may be shifted and/or stretched. Thus, the process 400 includes receiving a first set of shift values that control shifts of edges (e.g., rising and/or falling) of a first pulse (e.g., DQ RTT-OFF signal 82) used to de-assert ODT on a data pin (block 404). These values may be received via the command interface 14 and/or the I/O interface 16 of the memory device 10. The command interface 14 and/or the I/O interface 16 may also receive a second set of shift values that control shifts of edges (e.g., rising and/or falling) of a second pulse (e.g., DQS RTT-OFF signal 80) used to de-assert ODT on a data strobe pin (block 406). These shift values may include default values that indicate that the corresponding edge is not to be currently shifted (e.g., keep edge at a default location). Furthermore, each set of shift values may include a first value indicating a number of shifts in a first direction for a first edge (e.g., rising edge) and a second value indicating a number of shifts in a second direction for a second edge (e.g., falling edge).

To provide the various shifted edges, the process 400 includes shifting the first and second pulses (i.e., DQ pulse and DQS pulse, respectively) in the delay chain 140 to form a first plurality of shifted pulses (i.e., DQ pulses) and a second plurality of shifted pulses (i.e., DQS pulses (block 408). Shifting each pulse includes shifting the pulse in a forward direction by delaying a default command to cause backward shifted pulses of the corresponding plurality of shifted commands to be shifted backward relative to the delayed default pulse. In other words, by shifting the default pulse—CMD(0)—to a delayed position, any commands that are delayed fewer times in the delay pipeline 140 than the default pulse are "shifted backward." Shifting the pulse also includes shifting forward shifted pulses of the plurality of shifted commands in a forward direction relative to the delayed default command.

Selectors (e.g., multiplexers) may be used to select from the first plurality of shifted pulses based on the first set of shift values to form a first shifted pulse (block 410). The selectors may also be used to select from the second plurality of shifted pulses based on the second set of shift values to form a second shifted pulse (block 410). In some embodiments, selecting a shifted pulse from the corresponding plurality of shifted pulses includes 1) selecting a rising edge pulse, 2) selecting a falling edge pulse, and 3) combining the pulses together (e.g., using an OR gate). Furthermore, in some embodiments, at least one of the edges of the pulse may be selected based on the shift values and a length of a read preamble. For example, the second pulse may have a falling edge shifted by an additional clock cycle when a preamble is larger (e.g., 2) than a default value (e.g., 1). Also, the first pulse may have both edges shifted by an additional clock cycle when a preamble is larger (e.g., 2) than a default value (e.g., 1). Additionally, since DQS usage may be offset relative to data being read on DQ, the selection of the second shifted pulse maybe changed according to the DQS offset relative to DQ. In other words, the location of the second pulse may be shifted in a direction and magnitude set by the DQS offset (e.g., −2 or +2 tCK). Once the first shifted pulse and the second shifted pulse are formed by selection, the read operation may be completed using the first shifted pulse and the second shifted pulse (block 414).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
a command interface configured to receive a read command for a read operation and a command to de-assert on-die termination (ODT) for a data pin (DQ) during the read operation;
an input configured to receive an indication of a shift mode register value that corresponds to a number of shifts of a rising edge of the command in a backward direction relative to signals on the DQ;
a delay chain configured to delay the received command the number of shifts in the backward direction to generate a shifted rising edge command signal; and
combination circuitry to combine a falling edge command signal with the shifted rising edge command signal to form a transformed command.

2. The semiconductor device of claim 1, comprising an additional input configured to receive an indication of an additional shift mode register value that corresponds to a number of shifts of a falling edge of the command in a forward direction, wherein the delay chain is configured to delay the received command the number of shifts in the forward direction.

3. The semiconductor device of claim 2, comprising:
a third input configured to receive an indication of a third shift mode register value that corresponds to a number of shifts of a rising edge of an ODT command for a data pulse pin (DQS) in the backward direction relative to signals on the DQS; and
a fourth input configured to receive an indication of a fourth shift mode register value that corresponds to a number of shifts of a falling edge of the ODT command for the data pulse pin (DQS) in the forward direction.

4. The semiconductor device of claim 3, comprising a DQS offset input configured to receive an indication of a DQS offset used to shift the ODT command relative to the command.

5. The semiconductor device of claim 4, wherein a shift of the rising edge of the ODT command for the DQS comprises a combination of the third shift mode register value and the DQS offset.

6. The semiconductor device of claim 4, wherein a shift of the falling edge of the ODT command for the DQS comprises a combination of the fourth shift mode register value and the DQS offset.

7. The semiconductor device of claim 6, wherein the shift of the falling edge of the ODT comprises an additional shift of a clock cycle based on a length of a read preamble of the read operation that is larger than a default length of the read preamble.

8. The semiconductor device of claim 4, wherein the DQS offset shifts DQS the ODT command in a forward direction or the backward direction relative to the command.

9. The semiconductor device of claim 1, wherein a maximum number of shifts of the received command is limited to prevent de-assertion of ODT in an operation adjacent in time to read operation.

10. The semiconductor device of claim 1, wherein the combination circuitry comprises an OR gate.

11. The semiconductor device of claim 1, wherein the delay chain is configured to generate a plurality of backward shifted commands relative to a default command, wherein the default command comprises an unshifted command that is delayed through the delay chain by a maximum number of possible shifts in the backward direction to cause the backward shifted commands to be delayed fewer time in the delay chain.

12. A semiconductor device comprising:
a command interface configured to:
receive a first command to de-assert on-die termination (ODT) on a data pin (DQ) during a read operation; and
receive a second command to de-assert ODT on a data strobe pin (DQS) during the read operation;
a first mode register input configured to receive an indication of a backward shift mode register value that corresponds to a number of shifts of a rising edge of the first command in a backward direction relative to signals on the DQ;
a second mode register input configured to receive an indication of a backward shift mode register value that corresponds to a number of shifts of a rising edge of the second command in a backward direction relative to signals on the DQS;
a third mode register input configured to receive an indication of a forward shift mode register value that corresponds to a number of shifts of a falling edge of the first command in a forward direction relative to signals on the DQ;
a fourth mode register input configured to receive an indication of a forward shift mode register value that corresponds to a number of shifts of a falling edge of the second command in a forward direction relative to the DQS;
one or more delay chains configured to produce a plurality of shifted commands by delaying the received first and second commands a maximum number of shifts in the backward direction to generate a plurality of rising edge command signals of the first and second commands and a maximum number of shifts in the forward direction to generate a plurality of falling edge command signals of the first and second commands.

13. The semiconductor device of claim 12, comprising:
first selection circuitry configured to select a first selected rising edge command signal of the plurality of rising edge command signals of the first command based on the first mode register input and to select a first selected falling edge command signal from the plurality of falling edge command signals of the first command based on the third mode register input;
second selection circuitry configured to select a second selected rising edge command signal of the plurality of rising edge command signals of the second command based on the second mode register input and to select a second selected falling edge command signal from the plurality of falling edge command signals of the second command based on the fourth mode register input; and
combination circuitry configured to combine:
the first selected rising edge command signal with the first selected falling edge command signal to form a DQ ODT de-assert command; and
the second selected rising edge command signal with the second selected falling edge command signal to form a DQS ODT de-assert command.

14. The semiconductor device of claim 13, wherein the first selection circuitry is configured to select the first selected rising edge command signal and the first selected falling edge command signal based at least in part on a length of a read preamble of the read operation, and the second selection circuitry is configured to select the second selected falling edge command signal based at least in part on a length of a read preamble of the read operation.

15. The semiconductor device of claim 13, comprising a DQS offset input configured to receive an indication of a DQS offset indicating how many clock cycles a DQS period is to be offset from a DQ period in a backward or a forward direction.

16. The semiconductor device of claim 15, wherein the second selection circuitry is configured to select the second selected rising edge command signal and the second selected falling edge command signal based at least in part on the DQS offset.

17. The semiconductor device of claim 13, wherein the combination circuitry comprises:
- an first OR gate configured to combine the first selected rising edge command signal with the first selected falling edge command signal to form the DQ ODT de-assert command; and
- a second OR gate configured to combine the second selected rising edge command signal with the second selected falling edge command signal to form the DQS ODT de-assert command.

18. A method, comprising:
receiving a read command to begin a read operation;
receiving a first set of shift values to control edges of a first pulse configured to de-assert on-die termination (ODT) for a data pin relative to transmissions on the data pin during the read operation;
receiving a second set of shift values to control edges of a second pulse configured to de-assert on-die termination (ODT) for a data strobe pin relative to strobes on the data strobe pin, wherein the data strobe pin is used to capture data on the data pin during the read operation;
shifting the first and second pulses in at least one delay chain to form a first plurality of shifted pulses from the first pulse and to form a second plurality of shifted pulses from the second pulse, wherein shifting a pulse comprises:
- shifting the pulse in a backward direction relative to the transmissions or strobes by delaying a default pulse fewer times than a delayed default pulse corresponding to the transmissions to create backward shifted pulses of the plurality of shifted pulses; and
- shifting a forward shifted pulse of the plurality of shifted pulses in a forward direction relative to the delayed default pulse;

selecting an edge of the first pulse to form a first shifted pulse based at least in part on the first set of shift values;
selecting an edge of the second pulse to form a second shifted pulse based at least in part on the second set of shift values; and
performing the read operation using the first shifted pulse and the second shifted pulse to de-assert ODT for the data pin and the data strobe pin, respectively.

19. The method of claim 18, wherein selecting an edge of the first pulse comprises:
- selecting a rising edge pulse from the first plurality of shifted pulses;
- selecting a falling edge pulse from the first plurality of shifted pulses; and
- combining the rising edge pulse and the falling edge pulse to form the first shifted pulse.

20. The method of claim 18, wherein selecting an edge of the second pulse comprises:
- selecting a rising edge pulse from the second plurality of shifted pulses;
- selecting a falling edge pulse from the second plurality of shifted pulses; and
- combining the rising edge pulse and the falling edge pulse to form the second shifted pulse.

\* \* \* \* \*